(12) United States Patent
Hatori et al.

(10) Patent No.: US 6,944,194 B1
(45) Date of Patent: Sep. 13, 2005

(54) LIGHT SCANNING AND RECORDING APPARATUS

(75) Inventors: Masami Hatori, Kanagawa (JP); Shinichiro Sonoda, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/517,589

(22) Filed: Mar. 3, 2000

(30) Foreign Application Priority Data

Mar. 3, 1999 (JP) .................. 11-056236

(51) Int. Cl.[7] ............ H01S 3/10; H01S 5/00; H01S 3/08
(52) U.S. Cl. ............. 372/21; 372/22; 372/49; 372/92; 372/98
(58) Field of Search ............. 372/20, 22, 26, 372/24, 21, 11, 5, 27, 92, 99, 101, 102, 105, 372/108, 43, 98, 9, 12, 13, 49

(56) References Cited

U.S. PATENT DOCUMENTS

| | | | |
|---|---|---|---|
| 5,317,577 A * | 5/1994 | Urakami et al. ............. 372/21 |
| 5,387,998 A * | 2/1995 | Kitaoka et al. ............. 359/328 |
| 5,415,743 A * | 5/1995 | Harada ...................... 427/466 |
| 5,452,312 A * | 9/1995 | Yamamoto et al. ............ 372/5 |
| 5,541,945 A * | 7/1996 | Yamaguchi et al. .......... 372/20 |
| 5,617,435 A * | 4/1997 | Nagai et al. .................. 372/22 |
| 5,757,832 A * | 5/1998 | Uchida ........................ 372/45 |
| 5,757,840 A * | 5/1998 | Hiroki ......................... 372/96 |
| 5,802,096 A * | 9/1998 | Okuda ........................ 372/102 |
| 5,838,486 A | 11/1998 | Sonoda et al. ............. 359/332 |
| 6,061,157 A * | 5/2000 | Terahara ...................... 398/1 |

FOREIGN PATENT DOCUMENTS

| JP | 10-254001 A | | 9/1998 | ............. G02F 1/37 |
|---|---|---|---|---|
| JP | 10254001 | * | 9/1998 | ............. G02F 1/37 |
| JP | 10254001 A | * | 9/1998 | ............. G02F 1/37 |

* cited by examiner

Primary Examiner—Minsun Oh Harvey
Assistant Examiner—Armando Rodriguez
(74) Attorney, Agent, or Firm—Sughrue Mion, PLLC

(57) ABSTRACT

A wavelength selecting optical element such as a narrow band-pass filter or the like is provided between a semiconductor laser and a light wavelength conversion element formed of a bulk-shaped wavelength conversion crystal. The wavelength selecting optical element selects a wavelength of a laser beam which is to be reflected by an end surface of the light wavelength conversion element to be fed back to the semiconductor laser.

32 Claims, 26 Drawing Sheets

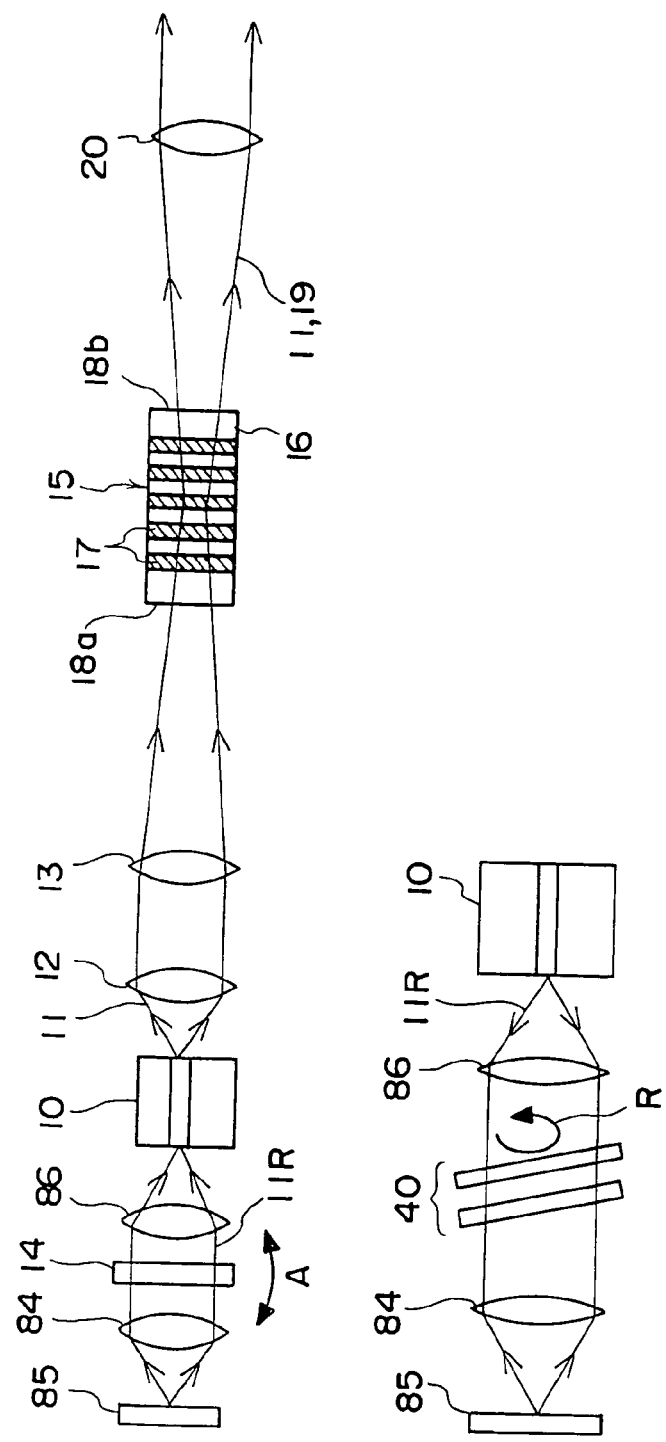

LIGHT SCANNING AND RECORDING APPARATUS

BACKGROUND OF THE INVENTION

1. Field of the Invention

The present invention relates to a light wavelength conversion module, which converts a fundamental wave to a second harmonic wave or the like by using a light wavelength conversion element, and to a light scanning and recording apparatus using the light wavelength conversion module. More precisely, the present invention relates to a light wavelength conversion module using a light wavelength conversion element formed of a bulk-shaped wavelength conversion crystal, and to a light scanning and recording apparatus utilizing the light wavelength conversion module.

2. Description of the Related Art

Conventionally, various methods for converting a fundamental wavelength to a second harmonic wavelength or the like have been proposed. For example, Bleombergen et al. have proposed a method for converting a fundamental wavelength to a second harmonic wavelength by using a light wavelength conversion element having a region in which a spontaneous polarization (domain) is reversed periodically (*Phys. Rev.*, vol. 127, No. 6, 1918 (1962)).

The wavelength conversion efficiency is proportional to a length interacting with the fundamental wave which is substantially an excitation light, i.e., the crystal length, and to the square of the power density of the excitation light. As the light beam diameter of the excitation light is made smaller in the wavelength conversion crystal in order to obtain a higher conversion efficiency, the power density of the light increases and the conversion efficiency improves accordingly. On the other hand, since a narrow beam diffuses drastically as the beam is propagated, the interactive length in the region where the power density is high is shortened and the conversion efficiency decreases accordingly. That is, there is a trade-off between power density and the interactive length. Due to this relationship, it is known that the conversion efficiency of the wavelength conversion element formed by bulk-shaped wavelength conversion crystal is relatively high when the beam diameter of the fundamental wave is several tens of $\mu$m. It is easy to perform optical adjustment of a beam having a diameter of several tens $\mu$m by inputting the beam into a wavelength conversion crystal which is, for example, about 1 mm$^3$. Consequently, an inexpensive light source with a small number of component parts can be used. Therefore, the development in fields such as laser beam printers for silver salt photosensitive materials, laser light sources for optical recording, and the like is anticipated. The beam, however, has a large diameter of several tens of $\mu$m. Therefore, there has been a problem with this method in that the obtained wavelength conversion efficiency is lower than that of a light wavelength conversion element of a light guiding wave channel type capable of producing beams with a narrow diameter.

Further, in order to generate a second harmonic wave, it is necessary to stabilize fluctuations of the wavelength of the fundamental wave emitted from a semiconductor laser to within 0.5 nm. If the fluctuation is not within the allowable wavelength range, the output of the second harmonic wave fluctuates due to the fluctuation of the wavelength of the semiconductor laser. An oscillation wavelength of a generally used excitation type semiconductor laser fluctuates by several nm due to changes in the driving current, changes in surrounding temperature, and even due to a very small return light. Therefore, there has been a problem with light wavelength conversion elements which utilize a semiconductor laser as a light source in that the output light amount thereof fluctuates when a second harmonic wave is generated, so that light cannot be output continuously.

Moreover, when the light wavelength conversion element comprising the above-mentioned periodic domain reversing structure is used, the wavelength conversion efficiency decreases significantly unless the oscillation wavelength of the semiconductor laser coincides with a wavelength which phase-matches with the period of a domain reversing segment. As a result, it is difficult to obtain a light source with a shorter wavelength which is of practical use.

SUMMARY OF THE INVENTION

The present invention is provided in view of the above-described circumstances of such a light wavelength conversion module which converts a wavelength of a laser beam emitted from a semiconductor laser by means of a light wavelength conversion element formed of a bulk-shaped wavelength conversion crystal. A first object of the present invention is to provide a light wavelength conversion module utilizing a light wavelength conversion element formed of a bulk-shaped wavelength conversion crystal which can lock an oscillation wavelength of a semiconductor laser accurately and stably oscillate light after the wavelength conversion. A second object of the present invention is to provide a high-power light wavelength conversion module utilizing a light wavelength conversion element formed of a bulk-shaped wavelength conversion crystal. A third object of the present invention is to provide a light wavelength conversion module comprising a light modulation device for modulating the intensity of wavelength-converted light. A fourth object of the present invention is to provide a light scanning and recording apparatus which utilizes the light wavelength conversion module of the present invention and is capable of ensuring an extremely wide dynamic range of a recording light, thereby enabling recording of high resolution images.

In one aspect of the present invention, a light wavelength conversion module comprises (a) a light wavelength conversion element formed of a wavelength conversion crystal, the light wavelength conversion element being for converting a wavelength of a fundamental wave, the light wavelength conversion element having an end surface; (b) a semiconductor laser for emitting a laser beam for entering the light wavelength conversion element as the fundamental wave; and (c) a transmission type wavelength selecting optical element which is disposed between the semiconductor laser and the light wavelength conversion element and selects a wavelength of the laser beam which is reflected by an end surface of the light wavelength conversion element and is to be fed back to the semiconductor laser. Namely, a transmission type wavelength selecting optical element is disposed between the semiconductor laser and the light wavelength conversion element and is optically connected to the semiconductor laser and light wavelength conversion element so that when laser beam is emitted from the semiconductor laser at least some laser beam is directed along an optical path including the light wavelength conversion element and the transmission type wavelength selecting optical element, and the end surface of the light wavelength conversion element partially reflects the laser beam and the wavelength selecting optical element selects a portion of the partially reflected laser beam for feedback to the semiconductor laser.

In another aspect of the present invention, a light wavelength conversion module comprises in addition to a light wavelength conversion element and a semiconductor laser similar to those described above, a light separating device for separating a part of the laser beam, which is to enter the light wavelength conversion element as the fundamental wave, before the laser beam enters the light wavelength conversion element, a reflecting member reflecting the separated laser beam so as to feed back the laser beam to the semiconductor laser, and a transmission type wavelength selecting optical element selecting a wavelength of the laser beam which is to be fed back to the semiconductor laser.

In yet another aspect of the present invention, a light wavelength conversion module comprises in addition to a light wavelength conversion element and a semiconductor laser similar to those described above, a reflecting member reflecting the laser beam which is emitted from the light wavelength conversion element and is to be fed back to the semiconductor laser, and a transmission type wavelength selecting optical element which selects a wavelength of the laser beam which is to be fed back to the semiconductor laser.

Moreover, in this aspect, it is preferable that an optical system, which separates a wavelength-modulated wave from the laser beam emitted from the light wavelength conversion element, is provided in the light wavelength conversion module.

In yet another aspect of the present invention, a light wavelength conversion module comprises in addition to a light wavelength conversion element and a semiconductor laser similar to those described above, a reflecting member reflecting a laser beam emitted from the semiconductor laser as a backward emitted light, which is directed in a direction other than toward the light wavelength conversion element, so as to feed back the laser beam to the semiconductor laser, and a transmission type wavelength selecting optical element which selects a wavelength of the laser beam which is to be fed back to the semiconductor laser.

In yet another aspect of the present invention, a light wavelength conversion module comprises in addition to a light wavelength conversion element and a semiconductor laser similar to those described above, a reflection type wavelength selecting optical element disposed between the semiconductor laser and the light wavelength conversion element, wherein the wavelength selecting optical element reflects a part of the laser beam so as to feed back the part of the laser beam to the semiconductor laser and selects a wavelength of the laser beam to be fed back.

In yet another aspect of the present invention, a light wavelength conversion module comprises in addition to a light wavelength conversion element and a semiconductor laser similar to those described above, a reflection type wavelength selecting optical element which reflects a laser beam which has exited from the light wavelength conversion element so as to feed back the laser beam to the semiconductor laser, and which selects a wavelength of the laser beam to be fed back.

Moreover, in this aspect, it is preferable that an optical system, which separates a wavelength-modulated wave from the laser beam which has exited from the light wavelength conversion element, is provided in the light wavelength conversion module.

In yet another aspect of the present invention, a light wavelength conversion module comprises in addition to a light wavelength conversion element and a semiconductor laser similar to those described above, a reflection type wavelength selecting optical element which reflects a laser beam emitted from the semiconductor laser as a backward emitted light, which is directed in a direction other than toward the light wavelength conversion element, so as to feed back the laser beam to the semiconductor laser, and which selects a wavelength of the laser beam to be fed back.

Moreover, as the above-described wavelength selecting optical element of either a transmission type or a reflection type, a narrow band-pass filter, for example, may be used preferably. Among such narrow band-pass filters, a thin film band-pass filter and a birefringent filter are particularly preferable.

When the above-mentioned thin film band-pass filter is used, it is preferably formed on a light emitting end surface of the semiconductor laser. When the thin film band-pass filter is used as the transmission type wavelength selecting optical element, the filter may be formed on a surface of the reflecting member which directs the laser beam to be fed back to the semiconductor laser.

Further, a bulk grating may also be used as the above-described wavelength selecting optical element of either transmission type or reflection type.

On the other hand, as the reflection type wavelength selecting element, a fiber grating made of an optical fiber such that a plurality of refractive index changing portions are formed at regular intervals on a core of the optical fiber may be used.

When such a fiber grating is used, it is preferable that a converging optical system for converging a laser beam, which is to enter the fiber grating as the fundamental wave, onto an end surface of the core of the fiber grating is provided.

On the other hand, it is preferable that the semiconductor laser which emits the laser beam as the fundamental wave is coupled to an end surface of the light wavelength conversion element.

When the semiconductor laser is coupled to an end surface of the light wavelength conversion element as such, it is preferable that a thin film narrow band-pass filter disposed between a light emitting surface of the semiconductor laser and the end surface of the light wavelength conversion element, is used as a transmission type wavelength selecting optical element, and that the filter selects a wavelength of the laser beam which is to be reflected by the end surface of the light wavelength conversion element and fed back to the semiconductor laser.

When the semiconductor laser is coupled to an end surface of the light wavelength conversion element as described above, it is also preferable that a thin film narrow band-pass filter disposed between a light emitting surface of the semiconductor laser and the end surface of the light wavelength conversion element, is used as a reflection type wavelength selecting optical element, and that the filter reflects a part of the laser beam so as to feed back the part of the laser beam to the semiconductor laser, and selects a wavelength of part of the laser beam to be fed back.

As the bulk-shaped wavelength conversion crystal, one of the following compositions may be used preferably: i) $LiNbO_3$ doped with MgO or ZnO; ii) $LiTaO_3$, $LiNbO_3$, $LiTaO_3$, $KTiOPO_4$, $KNbO_3$ doped with MgO or ZnO. Moreover, it is preferable that the bulk-shaped wavelength conversion crystal is a periodic domain reversing crystal on which domain reversing segments having reversed directions of spontaneous polarization are formed periodically, wherein the periodic domain reversing crystal converts the wavelength of the fundamental wave guided in a direction along which the domain reversing segments are aligned.

Preferably, a high power semiconductor laser having an output power of 300 mW or more is used as the semiconductor laser. Also, the semiconductor laser may preferably be a semiconductor laser which emits the laser beam in a single-peak spatial mode.

In yet another aspect of the present invention, a light wavelength conversion module comprises in addition to a light wavelength conversion element, a semiconductor laser, and a wavelength selecting optical element similar to those described above, a light modulation device for modulating the intensity of the laser beam which has exited from the light wavelength conversion element.

In yet another aspect of the present invention, a light wavelength conversion module comprises in addition to a light wavelength conversion element, a semiconductor laser, and a wavelength selecting optical element similar to those described above, a light modulation device for modulating the intensity of the laser beam which has exited from the light wavelength conversion element, by changing a driving current of the semiconductor laser to modulate the intensity of the fundamental wave emitted from the semiconductor laser.

In yet another aspect of the present invention, a light wavelength conversion module comprises in addition to a light wavelength conversion element, a semiconductor laser, and a wavelength selecting optical element similar to those described above, a light modulation device for modulating the pulse of the laser beam which has exited from the light wavelength conversion element.

A light scanning and recording apparatus according to the present invention comprises a light wavelength conversion module comprising a light modulation device for modulating the intensity or the pulse of a recording light on the basis of image signals expressing an image of a continuous tone, and a light wavelength conversion device for, by a nonlinear optical effect, converting the wavelength of the recording light whose intensity or pulse has been modulated, and a scanning device for scanning a recording material with the recording light whose wavelength has been converted, wherein the light scanning and recording apparatus utilizes a light wavelength conversion module according to the present invention as the light modulation device and the light wavelength conversion device.

In the light wavelength conversion module according to the present invention, the wavelength selecting optical element which is composed of a narrow band-pass filter, a bulk grating, a fiber grating or the like. Thus, the oscillation wavelength of the semiconductor laser is stabilized, and can be selected to a desired value, such as a wavelength which phase-matches with the period of the domain reversing segment, so that the laser beam which is to be fed back to the semiconductor laser can be locked.

The present invention provides a light wavelength conversion module utilizing a light wavelength conversion element formed of a bulk-shaped wavelength conversion crystal which can lock an oscillation wavelength of a semiconductor laser accurately, and can stably oscillate light which has been subjected to the wavelength conversion. The present invention also provides a light wavelength conversion module with high power which utilizes a light wavelength conversion element formed of a bulk-shaped wavelength conversion crystal. Moreover, the present invention provides a light wavelength conversion module comprising a light modulation device for modulating the intensity of the wavelength-converted light. Further, the present invention provides a light scanning and recording apparatus which utilizes the light wavelength conversion module of the present invention, so that an extremely wide dynamic range of the recording light can be secured, thereby enabling recording an image of a high gradation.

BRIEF DESCRIPTION OF THE DRAWINGS

FIGS. 5A and 5B are schematic side views showing a light wavelength conversion module according to a fourth embodiment of the present invention.

DETAILED DESCRIPTION OF THE PREFERRED EMBODIMENTS

Figure 1:
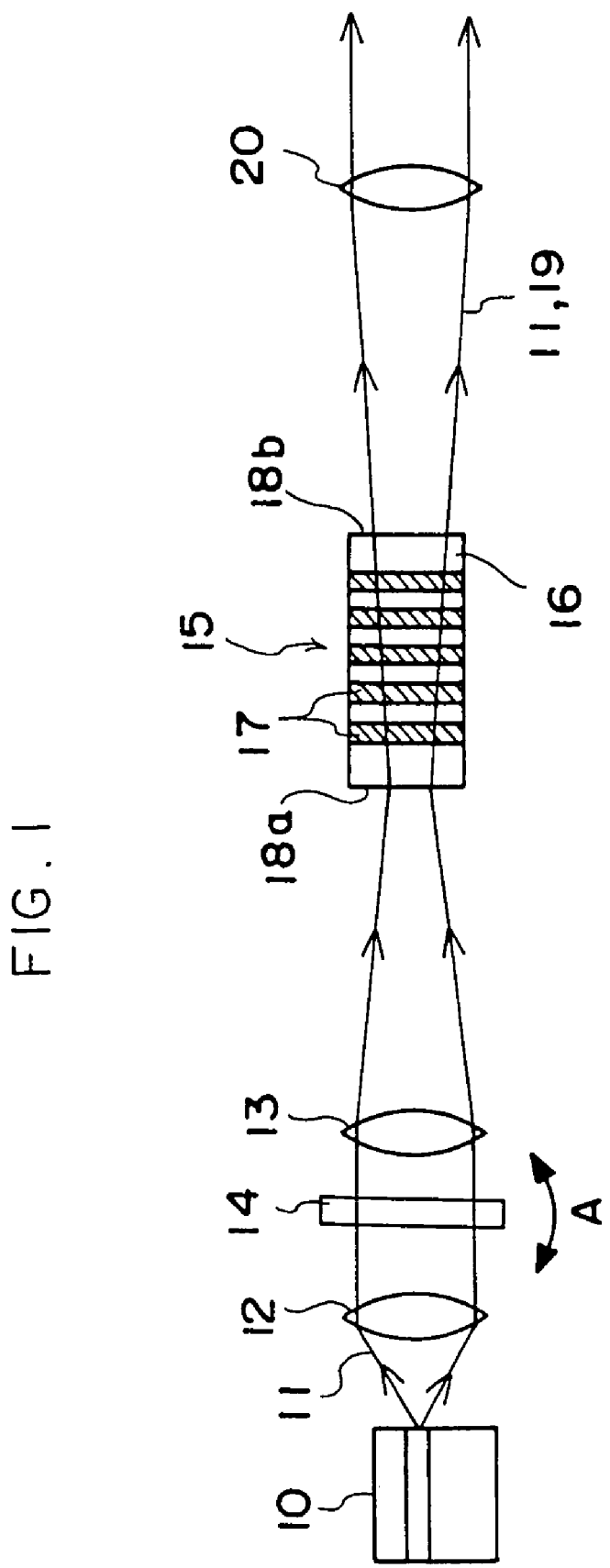
FIG. 1 is a schematic side view showing a light wavelength conversion module according to a first embodiment of the present invention.

Referring to the drawings, embodiments of the present invention will be described hereinafter.

FIG. 1 illustrates a light wavelength conversion module according to a first embodiment of the present invention. As shown in FIG. 1, the light wavelength conversion module comprises a semiconductor laser (laser diode) 10, a collimator lens 12 which makes laser beams 11 emitted from the semiconductor laser 10 in a divergent condition into parallel light, a condensing lens 13 converging the parallel laser beams 11, a narrow band-pass filter 14 disposed between the lenses 12 and 13 as a wavelength selecting optical element, and a light wavelength conversion element 15.

The light wavelength conversion element 15 is a periodic domain reversing structure in which domain reversing segments 17 are formed periodically on a crystal base 16. The crystal base 16 is formed by doping the ferroelectric $LiNbO_3$, which has a nonlinear optical effect, with, for example, 5 mol % of MgO (referred to as "MgO—LN" hereafter) by forming periodically. The domain reversing segment 17 is such that the direction of spontaneous polarization parallel to the Z-axis of the base is reversed.

Figure 2A:
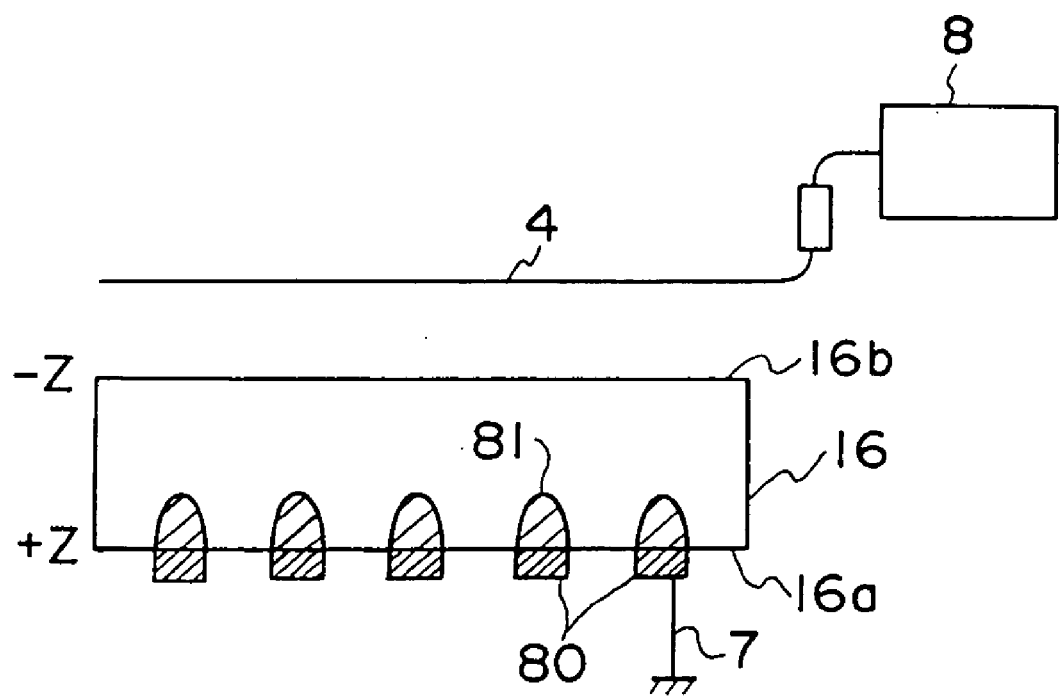
FIGS. 2A and 2B are schematic perspective views showing a manner in which a light wavelength conversion element used in the light wavelength conversion module according to the first embodiment is produced.
Figure 2B:
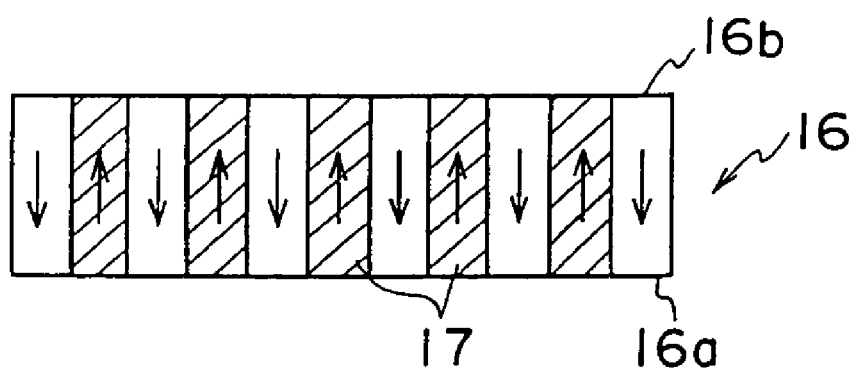

The periodic domain reversing structure is formed such that the domain reversing segments 17 are disposed along the direction of the X-axis of the crystal base 16. Considering the wavelength dispersion of the refractive index of MgO—LN, the period $\Lambda$ thereof is set to be 4.7 μm so that it may be the first order period with respect to wavelengths in the vicinity of 950 nm. Such a periodic domain reversing structure can be formed, for example, by methods shown in FIGS. 2A and 2B. In FIGS. 2A and 2B, a corona wire 4, a ground 7, and a power supply 8 are illustrated.

Monopolarization processing has been performed upon the MgO—LN crystal base 16, and the base has a thickness of 0.5 mm. The Z-surface of the base 16 has been optically polished in order to utilize the largest nonlinear optical constant $d_{33}$ effectively. On an optically polished +Z-surface 16a, periodic electrodes 80 repeated at a predetermined period ($\Lambda$=4.7 μm) are provided as shown in FIG. 2A by a well-known photolithographic process.

The structure illustrated in FIG. 2A was actually manufactured, and the following processes conducted thereon. A voltage of 1 kV was applied to the MgO—LN crystal base 16 from the high-voltage power supply 8 via the corona wire 4 disposed at a −Z-surface 16b for 5 minutes by corona charging. Polarization only of sections 81 opposing the periodic electrodes 80 on the MgO—LN crystal base 16 were reversed selectively to produce the domain reversing segments 17. The domain reversing segment 17 grew along the orientation of the electric field, and finally grew deep enough to penetrate the MgO—LN crystal base 16 as shown in FIG. 2B. That is, the domain reversing segments 17 and the other portions were formed so as to be clearly distinguished one from the other along the long region along the depthwise (thickness) direction of the crystal base 16.

After the Y-surface of the MgO—LN crystal base 16 was cut and polished, selective etching was performed by using an etchant formed by mixing HF (fluorine) and $HNO_3$. Observation of the cross-section (Y-surface) of the base 16 revealed that, at the positions where the periodic electrodes 80 were formed, the periodic domain reversing segments 17 penetrating from the −Z-surface 16b to the +Z-surface 16a at the period $\Lambda$=4.7 μm were formed with good control.

The −X-surface and the +X-surface of the MgO—LN crystal base 16 are then optically polished to complete the light wavelength conversion element 15.

As shown in FIG. 1, the laser beam 11 having a central wavelength of 950 nm and emitted from the semiconductor laser 10 is condensed by the condensing lens 13 and is converged at an end surface 18a of the light wavelength conversion element 15. Accordingly, the laser beam 11 enters the light wavelength conversion element 15 as the fundamental wave. The laser beam 11 is propagated through the light wavelength conversion element 15, is phase-matched (so-called pseudo-phase matching) in the periodic domain reversing region of the element 15, and the wavelength is converted to a second harmonic wave 19 having half of the wavelength, i.e., 475 nm. The second harmonic wave 19 is also propagated through the light wavelength conversion element 15, and emitted from an end surface 18b.

The laser beam 11, whose wavelength has not been converted, is also emitted in a divergent condition from the end surface 18b. The laser beam 11 and the second harmonic wave 19 are transformed into parallel rays by a collimator lens 20. The second harmonic wave 19 can be used for a certain application after being separated from the laser beam 11 by a band pass filter, a dichroic mirror, or the like (not shown).

In the present first embodiment, a predetermined coating, which reflects a part of the laser beam 11 having a wavelength of 950 nm, is provided on the end surface 18a of the light wavelength conversion element 15. The part of the laser beam 11 reflected at the end surface 18a is fed back to the semiconductor laser 10. That is, in this apparatus, the end surface 18a and a rear end surface (the left side end surface in FIG. 1) of the semiconductor laser 10 form an external resonator of the semiconductor laser 10.

The wavelength of the laser beam 11 to be transmitted through the narrow band-pass filter 14 is selected by the narrow band-pass filter 14 disposed in the external resonator. The semiconductor laser 10 oscillates at the selected wavelength. Since the selected wavelength varies according to the rotational position of the narrow band-pass filter 14 (the rotational position in the directions indicated by arrow A in FIG. 1), the oscillation wavelength of the semiconductor laser 10 can be selected and locked to a wavelength which phase-matches with the period of the domain reversing segment 17 by rotating the narrow band-pass filter 14 appropriately.

Figure 3:
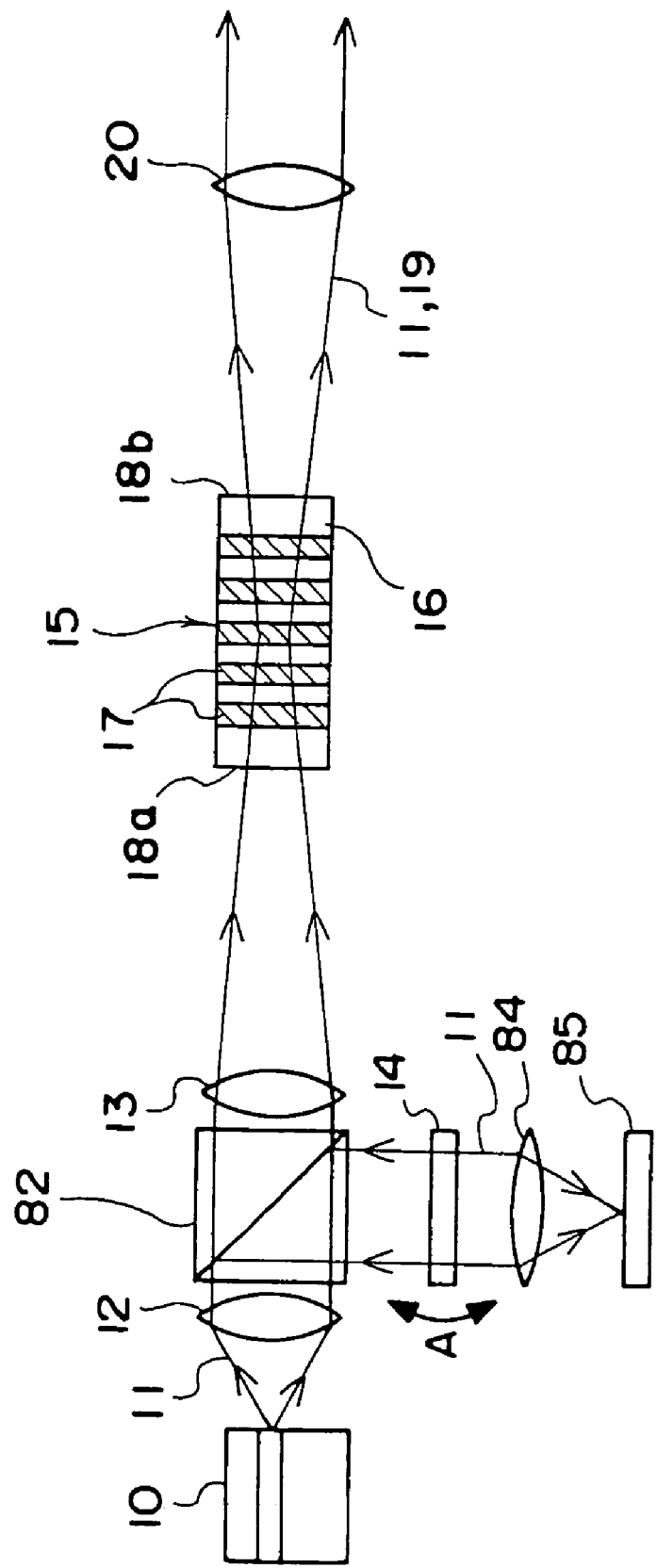
FIG. 3 is a schematic side view showing a light wavelength conversion module according to a second embodiment of the present invention.

Referring now to FIG. 3, a second embodiment of the present invention will be described. In FIG. 3, the same reference numerals are used to designate identical elements shown in FIG. 1, and detailed description thereof will be omitted. (The same holds for the other figures as well).

In the second embodiment of the present invention, a beam splitter 82 is provided between the collimator lens 12 and the condensing lens 13. A part of the laser beam 11 directed toward the light wavelength conversion element 15 is split off by the beam splitter 82. After passing through the narrow band-pass filter 14, the split-off laser beam 11 is converged by a condensing lens 84, and then reflected by a mirror 85 disposed at a convergent position where the split-off laser beam 11 is converged.

The reflected laser beam 11 traces back the optical path which has been followed until then, so as to be fed back to the semiconductor laser 10. That is, in this apparatus, the mirror 85 and a rear end surface (the left side end surface in FIG. 3) of the semiconductor laser 10 form an external resonator of the semiconductor laser 10.

The wavelength of the laser beam 11 to be fed back is selected by the narrow band-pass filter 14 disposed in the external resonator. The semiconductor laser 10 oscillates at the selected wavelength. Since the selected wavelength varies according to the rotational position of the narrow band-pass filter 14 (the rotational position in the directions indicated by arrow A in FIG. 3), the oscillation wavelength of the semiconductor laser 10 can be selected and locked to a wavelength which phase-matches with the period of the domain reversing segment 17 by rotating the narrow band-pass filter 14 appropriately.

Figure 4:
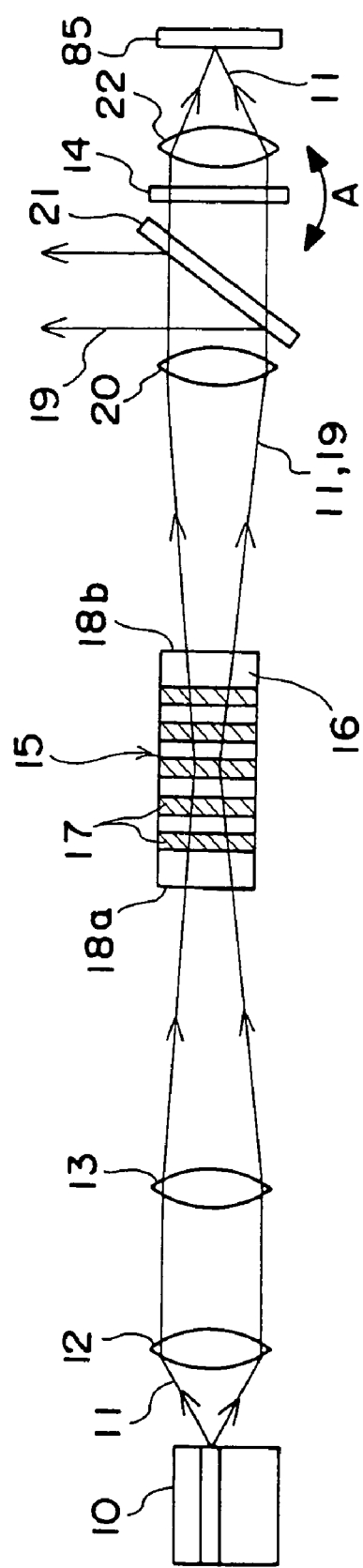
FIG. 4 is a schematic side view showing a light wavelength conversion module according to a third embodiment of the present invention.

Referring now to FIG. 4, a third embodiment of the present invention will be described. In the third embodiment, the second harmonic wave 19 emitted from the crystal end surface 18b of the light wavelength conversion element 15 and the laser beam 11 whose wavelength has not been converted are transformed into parallel rays by the collimator lens 20. The second harmonic waves 19 which have been made parallel are reflected by a dichroic mirror 21 to be directed to positions at which they are used. On the other hand, the laser beam 11 whose wavelength has not been converted is transmitted through the dichroic mirror 21 and the narrow band-pass filter 14, and is condensed by a condensing lens 22 and converged on the mirror 85.

The laser beam 11 reflected by the mirror 85 traces back the optical path which has been followed until then, so as to be fed back to the semiconductor laser 10. That is, in this apparatus, the mirror 85 and a rear end surface (the left side end surface in FIG. 4) of the semiconductor laser 10 form an external resonator of the semiconductor laser 10.

Also in this case, the oscillation wavelength of the semiconductor laser 10 can be selected and locked to a wavelength which phase-matches with the period of the domain reversing segment 17 by rotating the narrow band-pass filter 14 appropriately in the directions indicated by arrow A.

Referring now to FIG. 5A, a fourth embodiment of the present invention will be described. In the fourth embodiment, a laser beam 11R (backward emitted light), which is not directed toward the light wavelength conversion element 15, is transformed into parallel rays by a collimator lens 86. After passing through the narrow band-pass filter 14, the parallel laser beams 11R are condensed by the condensing lens 84 so as to be converged on the mirror 85.

The laser beam 11R reflected by the mirror 85 traces back the optical path, which has been followed until then, so as to be fed back to the semiconductor laser 10. That is, in this apparatus, the mirror 85 and a front end surface (the right-hand side end surface in FIG. 5A) of the semiconductor laser 10 form an external resonator of the semiconductor laser 10.

The wavelength of the laser beam 11R to be fed back is then selected by the narrow band-pass filter 14 disposed in the external resonator. The semiconductor laser 10 oscillates at the selected wavelength. Since the selected wavelength varies according to the rotational position of the narrow band-pass filter 14 (the rotational position in the directions indicated by arrow A in FIG. 5A), the oscillation wavelength of the semiconductor laser 10 can be selected and locked to a wavelength which phase-matches with the period of the domain reversing segment 17 by rotating the narrow band-pass filter 14 appropriately.

In a light wavelength conversion module having a structure similar to the fourth embodiment, a transverse single mode oscillation laser having an oscillation wavelength of 950 nm and a relatively large output light amount of 300 mW was used as the semiconductor laser 10, and the narrow band-pass filter 14 was set to have a half band width of 0.5 nm, and the period reversing domain crystal was set to have a length of 5 mm. Under these conditions, the oscillation wavelength of the semiconductor laser 10 was selected and locked to a wavelength which phase-matched the period of the domain reversing segment 17. The longitudinal mode of the semiconductor laser 10 was multimode oscillation before the wavelength was locked. However, substantially a single longitudinal mode oscillation was observed after the locking of the wavelength. Moreover, an output light amount of 1 mW, which is within a range which is of practical use, was obtained for the oscillated second harmonic wave 19 at this time.

Figure 6B:
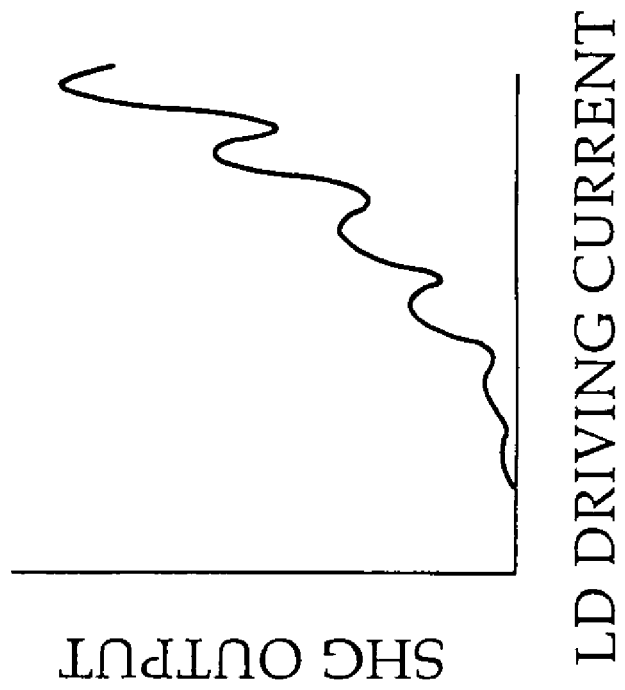
FIG. 6B is a graph in which an output light amount of a second harmonic wave is plotted against the driving current of the semiconductor laser in the light wavelength conversion module according to the fourth embodiment.
Figure 6A:
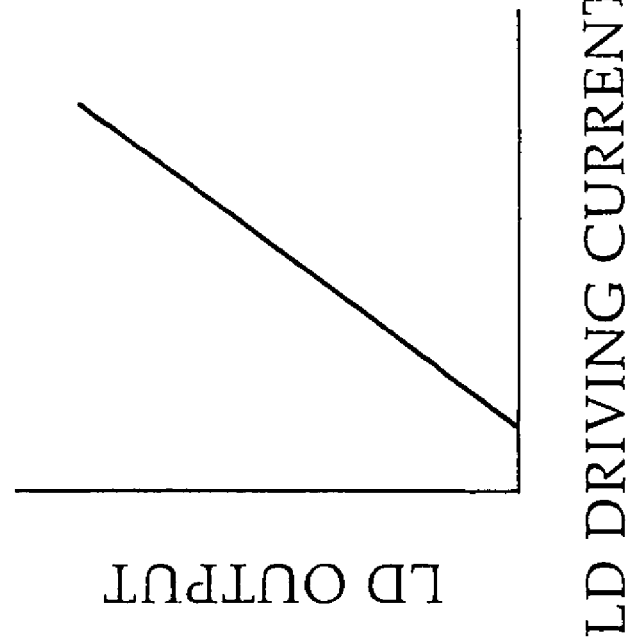
FIG. 6A is a graph in which an output light amount of a fundamental wave is plotted against a driving current of a semiconductor laser in the light wavelength conversion module according to the fourth embodiment of the present invention.

When the driving current of the semiconductor laser was increased, it was observed that the oscillation wavelength of the semiconductor laser fluctuated periodically within a range of about 0.2 nm. This wavelength fluctuation was caused by a combined resonator mode produced from an etalon mode of the semiconductor laser and an external resonator mode. The output light amount of the semiconductor laser increased linearly as the driving current increased as shown in FIG. 6A. However, the output light amount of the second harmonic wave exhibited the characteristic that, as shown in FIG. 6B, an asymptotic line thereof increases in proportion to the square of the driving current of the semiconductor laser, and that the output light amount is influenced by the wavelength fluctuations of the semiconductor laser so as to repeatedly increase and decrease periodically.

However, since this characteristic is reproducible, this characteristic is not problematic when using the light wavelength conversion module of the present invention.

By setting the reflectance of a coating on the opposite side of the light wavelength conversion element of the semiconductor laser to substantially 0%, the etalon mode of the semiconductor laser disappears and only the external resonator mode remains. As a result, the oscillation wavelength of the semiconductor laser is stabilized and the output light amount of the second harmonic wave increases in proportion to the square of the driving current.

A birefringent filter 40 may also be used as the narrow band-pass filter. In FIG. 5B, the semiconductor laser and the external resonator portion provided at the rearside of the semiconductor laser are shown. The birefringent filter 40 is generally called a Lyot filter, and is made of a birefringent material such as calcite. The birefringent filter 40 is held by a rotatable holding member so as to rotate freely in the direction indicated by arrow R, that is, around the beam axis of the laser beam 11R. Accordingly, when the birefringent filter 40 is rotated, the wavelength of the laser beam 11R is selected according to the rotational position thereof, and the oscillation wavelength of the semiconductor laser 10 can be selected and locked to a wavelength which phase-matches the period of the domain reversing segment 17.

The birefringent filter 40 can be used in place of the narrow band-pass filter 14 in other structures as well, and functions and effects similar to those mentioned above can also be obtained in this case.

Figure 7:
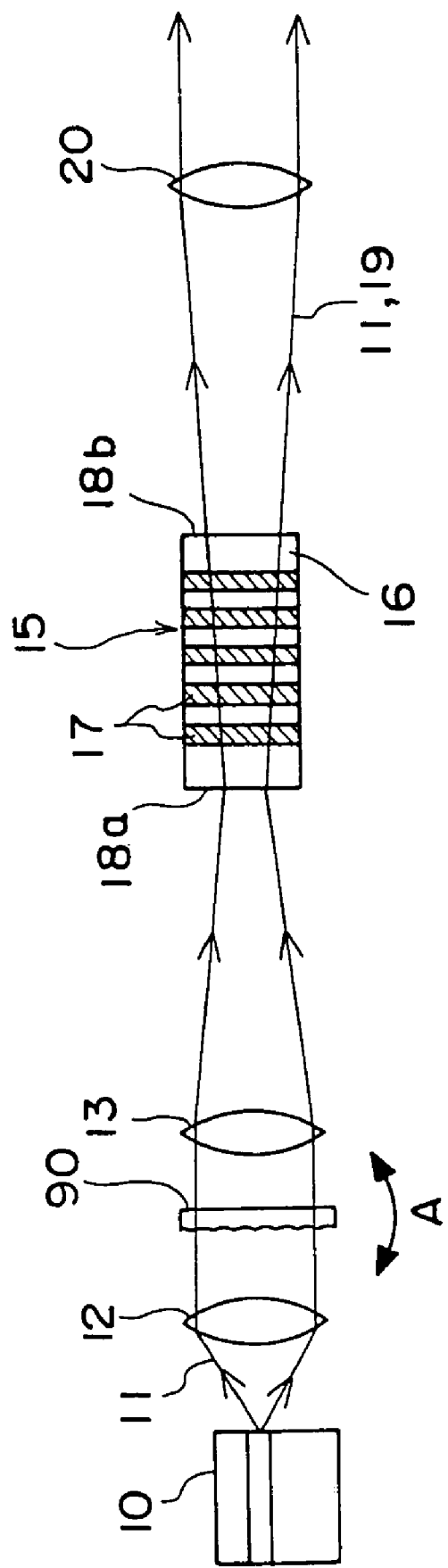
FIG. 7 is a schematic side view showing a light wavelength conversion module according to a fifth embodiment of the present invention.

Referring now to FIG. 7, a fifth embodiment of the present invention will be described. A light wavelength conversion module of the fifth embodiment differs from the one shown in FIG. 1 in that, in the present fifth embodiment, a transmission type bulk grating 90 is used in place of the narrow band-pass filter 14. The bulk grating 90 functions as a wavelength selecting optical element as well. The oscillation wavelength of the semiconductor laser 10 can be selected and locked to a wavelength which phase-matches the period of the domain reversing segment 17 by rotating the bulk grating 90 appropriately in the directions indicated by arrow A.

The transmission type bulk grating 90 can be used in place of the narrow band-pass filter 14 in each of the structures shown in FIGS. 3, 4, 5A and 5B, and functions and effects similar to those described above can also be obtained in each case.

Figure 8:
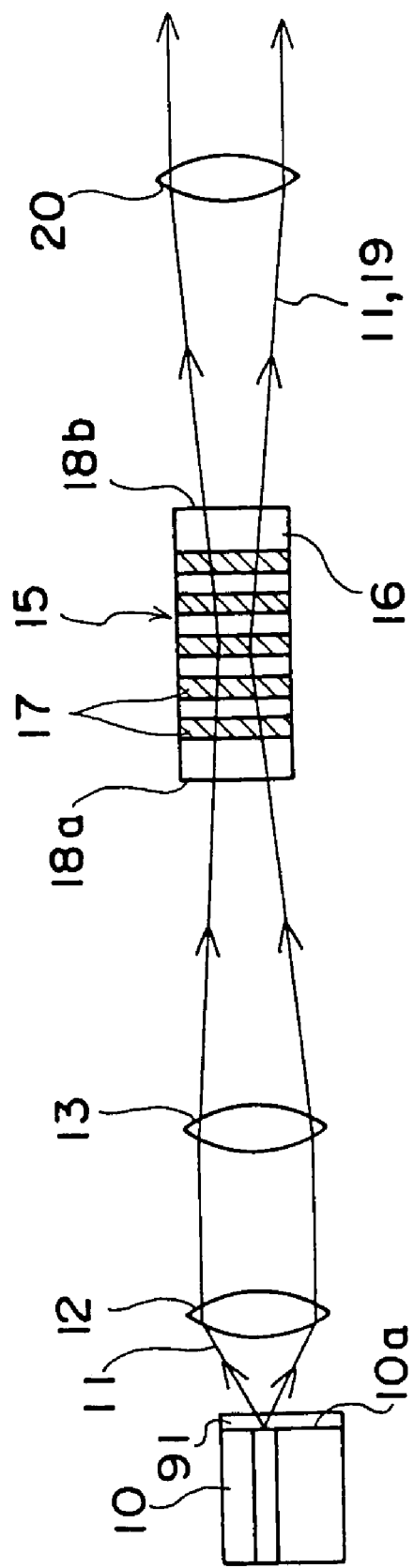
FIG. 8 is a schematic side view showing a light wavelength conversion module according to a sixth embodiment of the present invention.

Referring now to FIG. 8, a sixth embodiment of the present invention will be described. A light wavelength conversion module of the sixth embodiment differs from the one shown in FIG. 1 in that, in the present sixth embodiment, a transmission type narrow-band thin film band-pass filter 91 is used in place of the narrow band-pass filter 14. The narrow-band thin film band-pass filter 91 is formed on a light emitting end surface 10a of the semiconductor laser 10.

The narrow-band thin film band-pass filter 91 is a filter which selectively transmits lights of a wavelength corresponding to the structure of the thin film. By providing such a narrow-band thin film band-pass filter 91 in the external resonator of the semiconductor laser 10 formed by the end surface 18a of the light wavelength conversion element 15 and a rear end surface (the left side end surface in FIG. 8) of the semiconductor laser 10, the oscillation wavelength of the semiconductor laser 10 can be selected and locked to a wavelength which phase-matches the period of the domain reversing segment 17.

Figure 9:
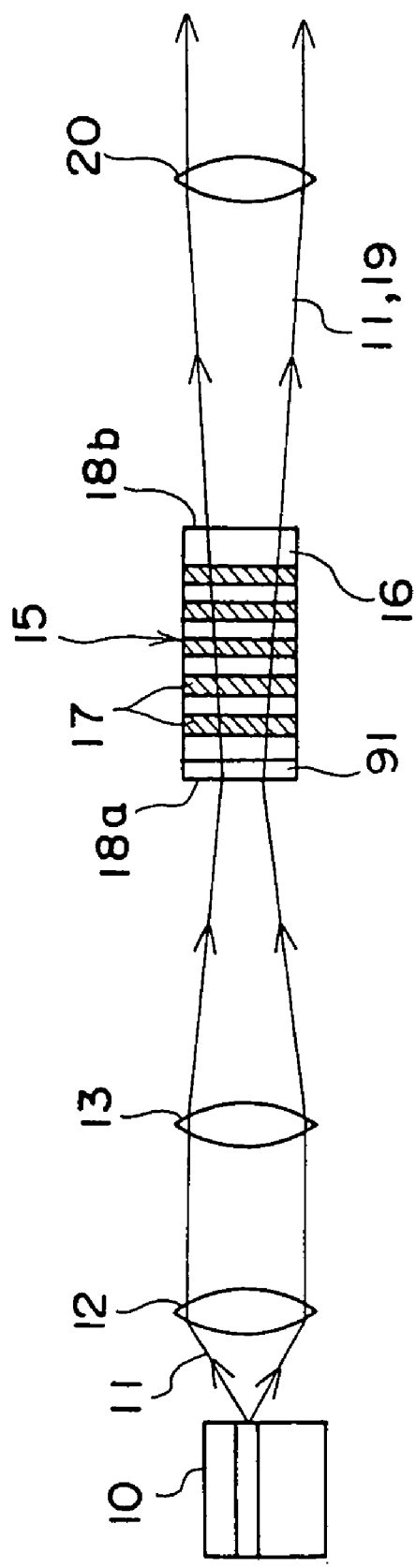
FIG. 9 is a schematic side view showing a light wavelength conversion module according to a seventh embodiment of the present invention.

Referring now to FIG. 9, a seventh embodiment of the present invention will be described. A light wavelength conversion module of the seventh embodiment differs from the one shown in FIG. 8 in that, in the present seventh embodiment, the transmission type narrow-band thin film band-pass filter 91 is disposed at a different position. That is, in the present seventh embodiment, the narrow-band thin film band-pass filter 91 is formed on an end surface which includes the end surface 18a of the light wavelength conversion element 15.

In the present seventh embodiment as well, the oscillation wavelength of the semiconductor laser 10 can be selected and locked to a wavelength which phase-matches the period of the domain reversing segment 17, by providing the narrow-band thin film band-pass filter 91 in the external resonator of the semiconductor laser 10 formed by the end surface 18a of the light wavelength conversion element 15 and a rear end surface (the left side end surface in FIG. 9) of the semiconductor laser 10.

Figure 10:
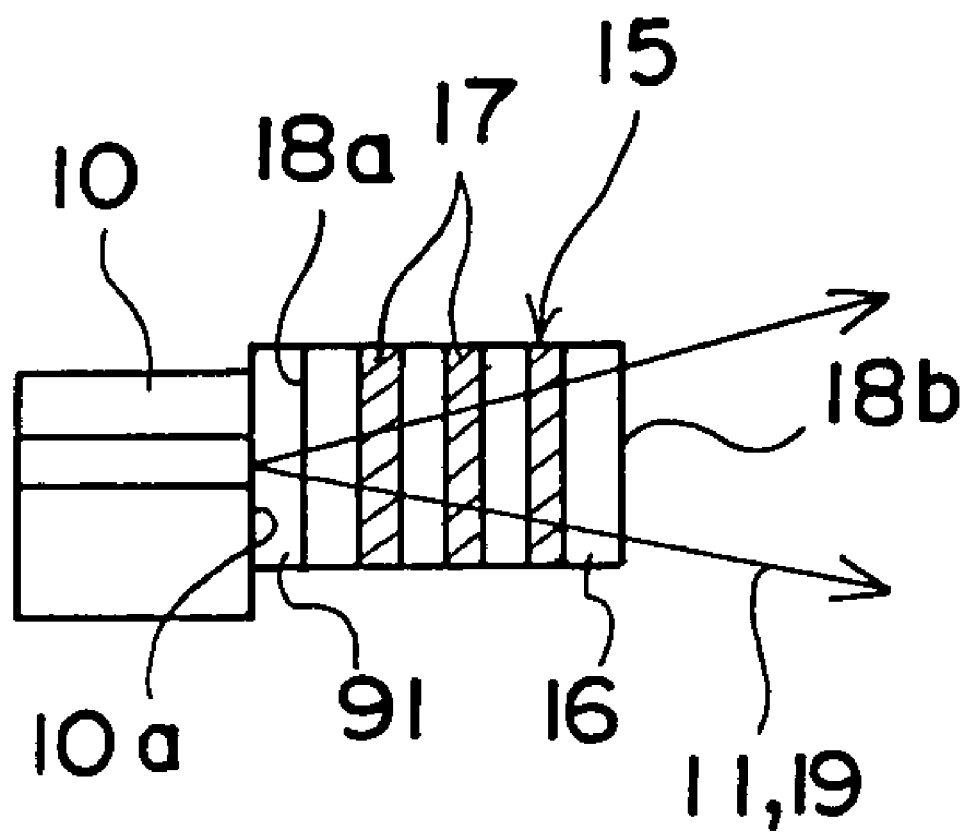
FIG. 10 is a schematic side view showing a light wavelength conversion module according to an eighth embodiment of the present invention.

Referring now to FIG. 10, an eighth embodiment of the present invention will be described. Comparing a light wavelength conversion module of the eighth embodiment with the one shown in FIG. 9, the difference is that, in the present eighth embodiment, the collimator lens 12 and the condensing lens 13 are omitted and the light emitting end surface 10a of the semiconductor laser 10 is coupled directly to the light wavelength conversion element 15 which is 1 mm in length via the transmission type narrow-band thin film band-pass filter 91.

In the present eighth embodiment as well, the oscillation wavelength of the semiconductor laser 10 can be selected and locked to a wavelength which phase-matches the period of the domain reversing segment 17 by providing the narrow-band thin film band-pass filter 91 in the external resonator of the semiconductor laser 10 formed by the end surface 18a of the light wavelength conversion element 15 and a rear end surface (the left side end surface in FIG. 10) of the semiconductor laser 10.

Moreover, since the light wavelength conversion module of the present eighth embodiment does not require an incident optical system which causes the fundamental wave to enter the light wavelength conversion element, the structure of the light wavelength conversion module is simple, and it is very easy to carry out optical adjustments.

When the semiconductor laser 10 is coupled to the light wavelength conversion element 15 as described above, the transmission type narrow-band thin film band-pass filter 91 can be formed not only between the semiconductor laser 10 and the light wavelength conversion element 15, but also, for example, on the end surface 18b of the light wavelength conversion element 15.

Further, when the semiconductor laser 10 is coupled to the light wavelength conversion element 15, the wavelength selecting optical element is not limited to the transmission type narrow-band thin film band-pass filter 91. For example, in the above-described structure shown in FIG. 4, the lenses 12 and 13 may be omitted and the semiconductor laser 10 may be coupled directly to the light wavelength conversion element 15.

Figure 11:
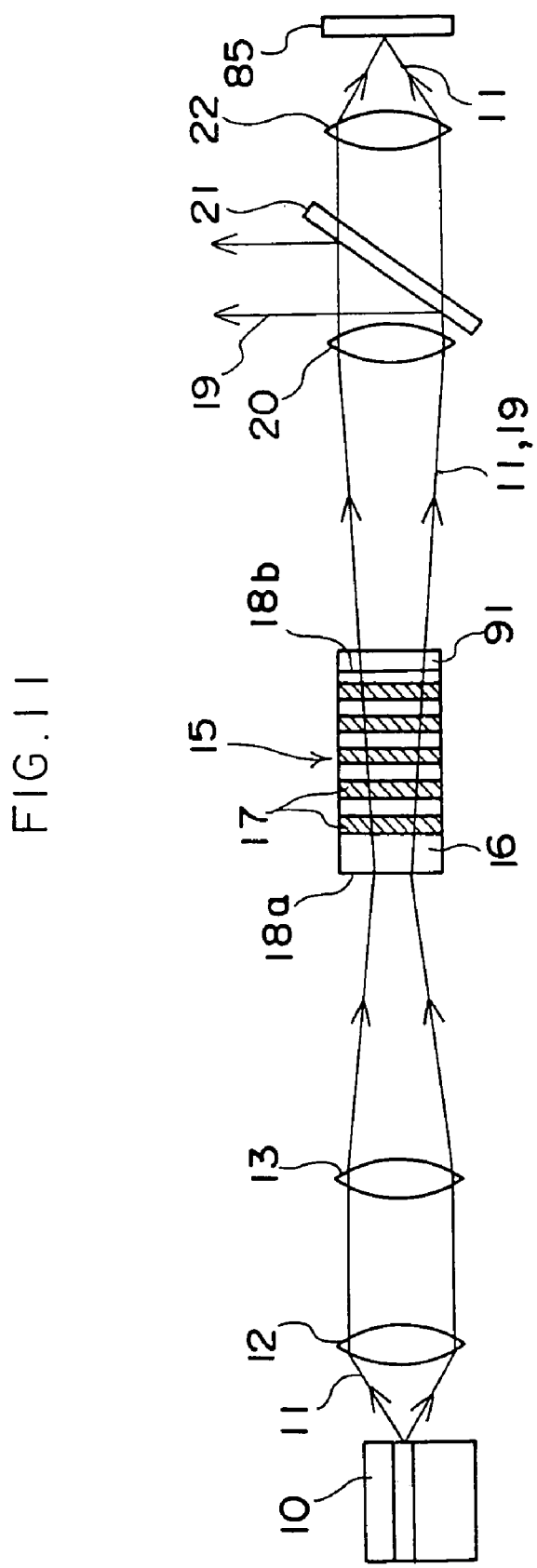
FIG. 11 is a schematic side view showing a light wavelength conversion module according to a ninth embodiment of the present invention.

Referring now to FIG. 11, a ninth embodiment of the present invention will be described. Comparing a light wavelength conversion module of the ninth embodiment with the one shown in FIG. 4, the difference is that, in the present ninth embodiment, the transmission type narrow-band thin film band-pass filter 91 is used in place of the narrow band-pass filter 14. The narrow-band thin film band-pass filter 91 is formed on the end surface 18b of the light wavelength conversion element 15.

In the present ninth embodiment as well, the oscillation wavelength of the semiconductor laser 10 can be selected and locked to a wavelength which phase-matches the period of the domain reversing segment 17, by providing the narrow-band thin film band-pass filter 91 in the external resonator of the semiconductor laser 10 formed by the mirror 85 and a rear end surface (the left side end surface in FIG. 11) of the semiconductor laser 10.

Figure 12:
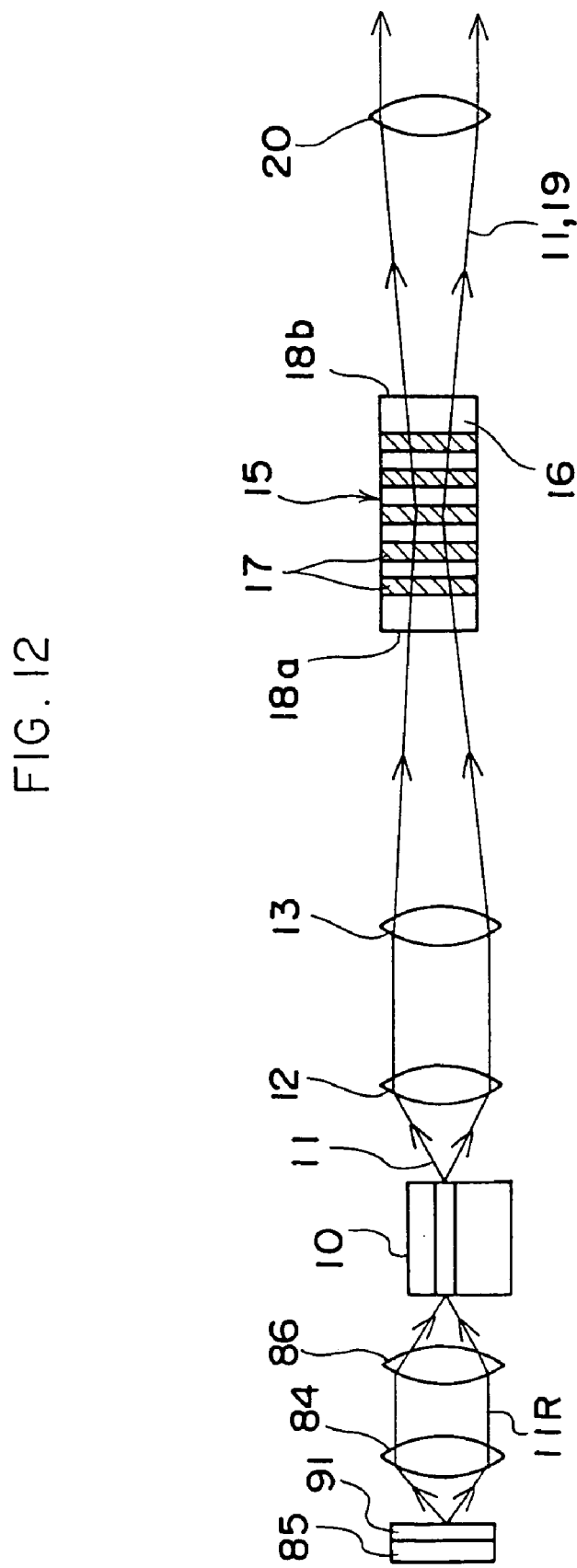
FIG. 12 is a schematic side view showing a light wavelength conversion module according to a tenth embodiment of the present invention.

Referring now to FIG. 12, a tenth embodiment of the present invention will be described. Comparing a light wavelength conversion module of the tenth embodiment with the ones shown in FIGS. 5A and 5B, the difference is that, in the present tenth embodiment, the transmission type narrow-band thin film band-pass filter 91 is used in place of the narrow band-pass filter 14. The narrow-band thin film band-pass filter 91 is formed on a reflecting surface of the mirror 85.

In the present tenth embodiment as well, the oscillation wavelength of the semiconductor laser 10 can be selected and locked to a wavelength which phase-matches with the period of the domain reversing segment 17, by providing the narrow-band thin film band-pass filter 91 in the external resonator of the semiconductor laser 10 formed by the mirror 85 and a front end surface (the right side end surface in FIG. 12) of the semiconductor laser 10.

Of course, the transmission type narrow-band thin film band-pass filter 91 described above can be used in place of the narrow band-pass filter 14 in the structure shown in FIG. 3. In this case, the narrow-band thin film band-pass filter 91 may be formed, for example, on the reflecting surface of the mirror 85 or on a front end surface (the right side end surface in FIG. 3) of the semiconductor laser 10.

Figure 13:
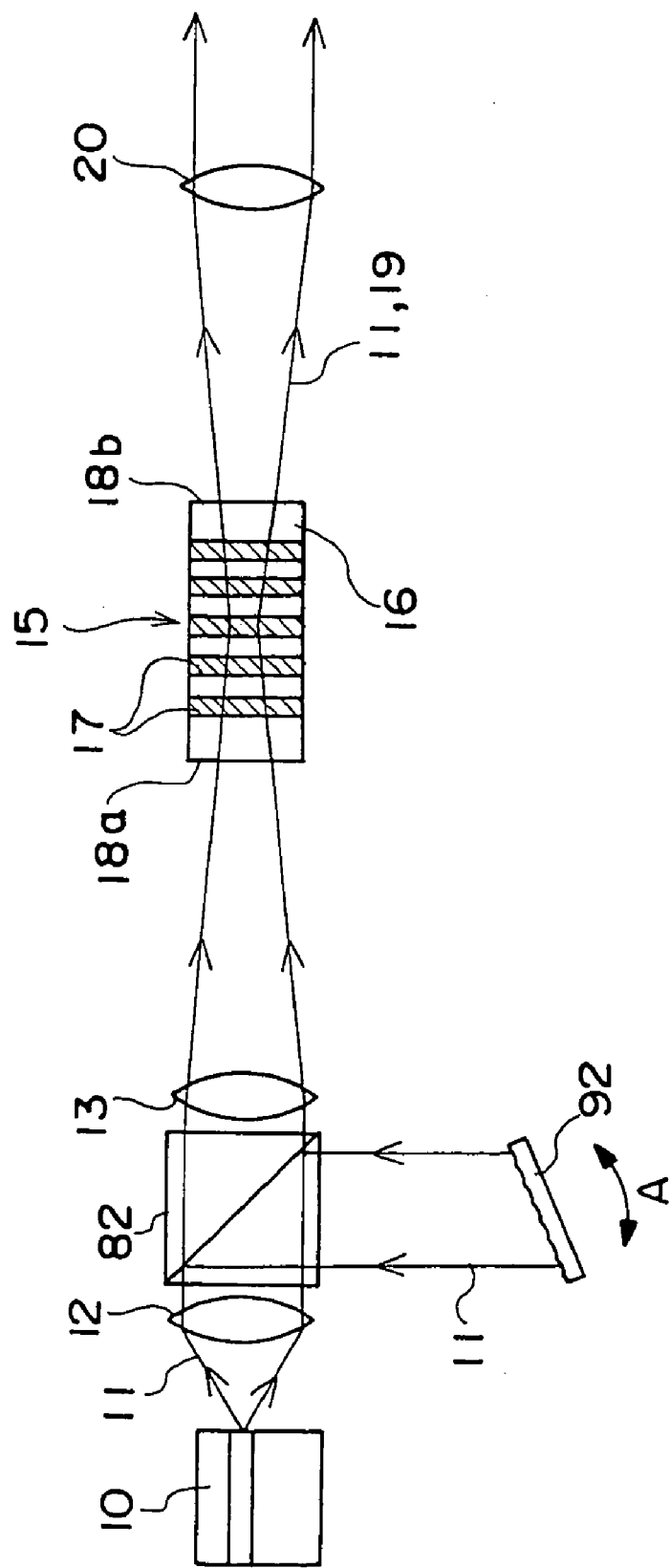
FIG. 13 is a schematic side view showing a light wavelength conversion module according to an eleventh embodiment of the present invention.

Referring now to FIG. 13, an eleventh embodiment of the present invention will be described. Comparing a light wavelength conversion module of the eleventh embodiment with the one shown in FIG. 3, differences are that, in the present eleventh embodiment, a reflection type bulk grating 92 is provided in place of the mirror 85, and the narrow band-pass filter 14 and the condensing lens 84 are omitted.

The reflection type bulk grating 92 reflects the incident laser beam 11. That is, in this apparatus, the bulk grating 92 and a rear end surface (the left side end surface in FIG. 13) of the semiconductor laser 10 form an external resonator of the semiconductor laser 10. The bulk grating 92 functions as a wavelength selecting optical element as well, and the oscillation wavelength of the semiconductor laser 10 can be selected and locked to a wavelength which phase-matches the period of the domain reversing segment 17 by rotating the bulk grating 92 appropriately in the directions indicated by arrow A.

Figure 14:
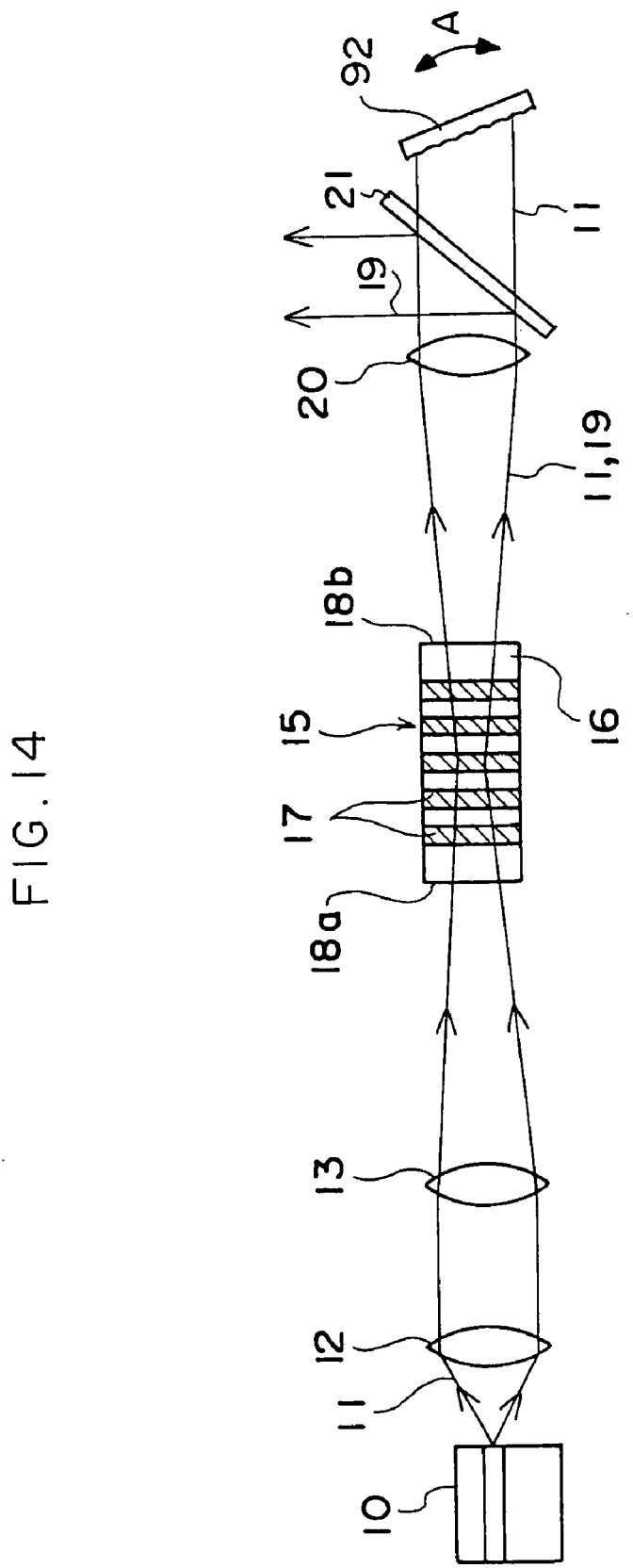
FIG. 14 is a schematic side view showing a light wavelength conversion module according to a twelfth embodiment of the present invention.

Referring now to FIG. 14, a twelfth embodiment of the present invention will be described. Comparing a light wavelength conversion module of the twelfth embodiment with the one shown in FIG. 4, differences are that, in the present twelfth embodiment, the reflection type bulk grating 92 is provided in place of the mirror 85, and the narrow band-pass filter 14 and the condensing lens 84 are omitted.

The reflection type bulk grating 92 reflects the incident laser beam 11. That is, in this apparatus, the bulk grating 92 and a rear end surface (the left side end surface in FIG. 14) of the semiconductor laser 10 form an external resonator of the semiconductor laser 10. The bulk grating 92 functions as a wavelength selecting optical element as well, and the oscillation wavelength of the semiconductor laser 10 can be selected and locked to a wavelength which phase-matches the period of the domain reversing segment 17 by rotating the bulk grating 92 appropriately in the directions indicated by arrow A.

Figure 15:
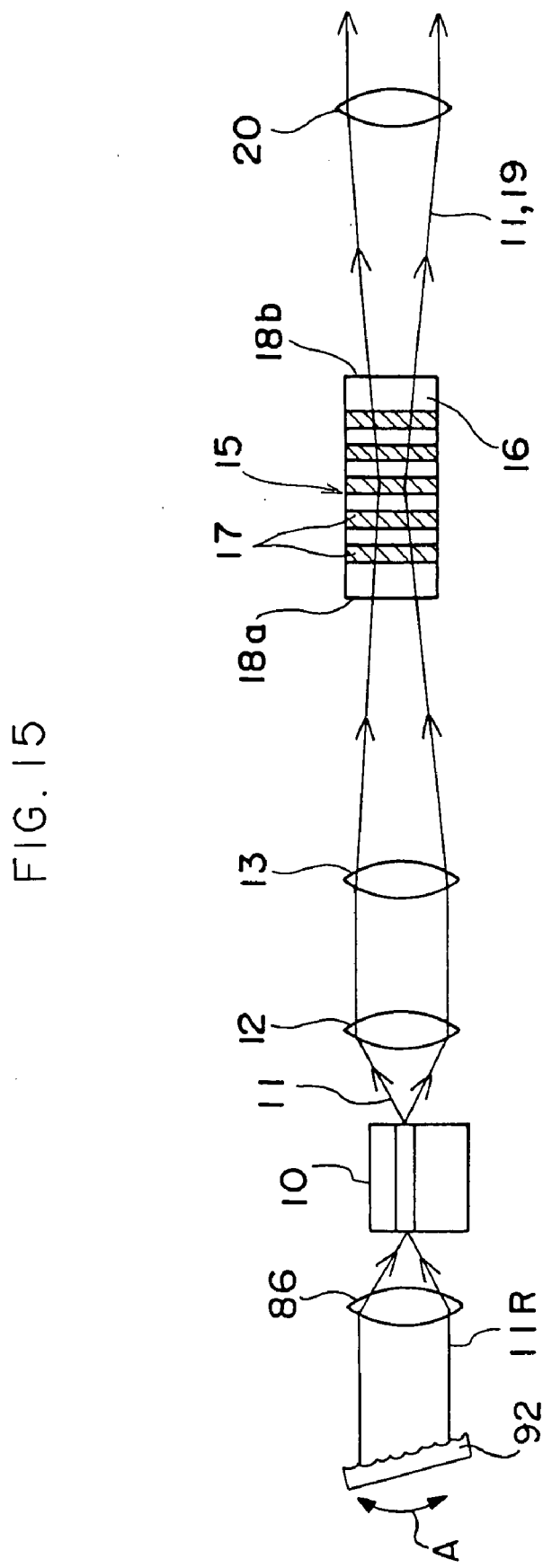
FIG. 15 is a schematic side view showing a light wavelength conversion module according to a thirteenth embodiment of the present invention.

Referring now to FIG. 15, a thirteenth embodiment of the present invention will be described. Comparing a light wavelength conversion module of the thirteenth embodiment with the ones shown in FIGS. 5A and 5B, differences are that, in the present thirteenth embodiment, the reflection type bulk grating 92 is provided in place of the mirror 85, and the condensing lens 84 and the narrow band-pass filter 14 are omitted.

The reflection type bulk grating 92 reflects the incident laser beam 11. That is, in this apparatus, the bulk grating 92 and a front end surface (the right side end surface in FIG. 15) of the semiconductor laser 10 form an external resonator of the semiconductor laser 10. The bulk grating 92 functions as a wavelength selecting optical element as well, and the oscillation wavelength of the semiconductor laser 10 can be selected and locked to a wavelength which phase-matches the period of the domain reversing segment 17 by rotating the bulk grating 92 appropriately in the directions indicated by arrow A.

Instead of the reflection type bulk grating 92, a reflection type narrow-band thin film band-pass filter may be used. A fourteenth embodiment of the present invention having such a structure will be described hereinafter with reference to FIG. 16. Comparing a light wavelength conversion module of the fourteenth embodiment with the one shown in FIG. 15, differences are that, in the present fourteenth embodiment, the collimator lens 86 and the reflection type bulk grating 92 are omitted, and a reflection type narrow-band thin film band-pass filter 95 is formed on the rear end surface 10b of the semiconductor laser 10.

Figure 16:
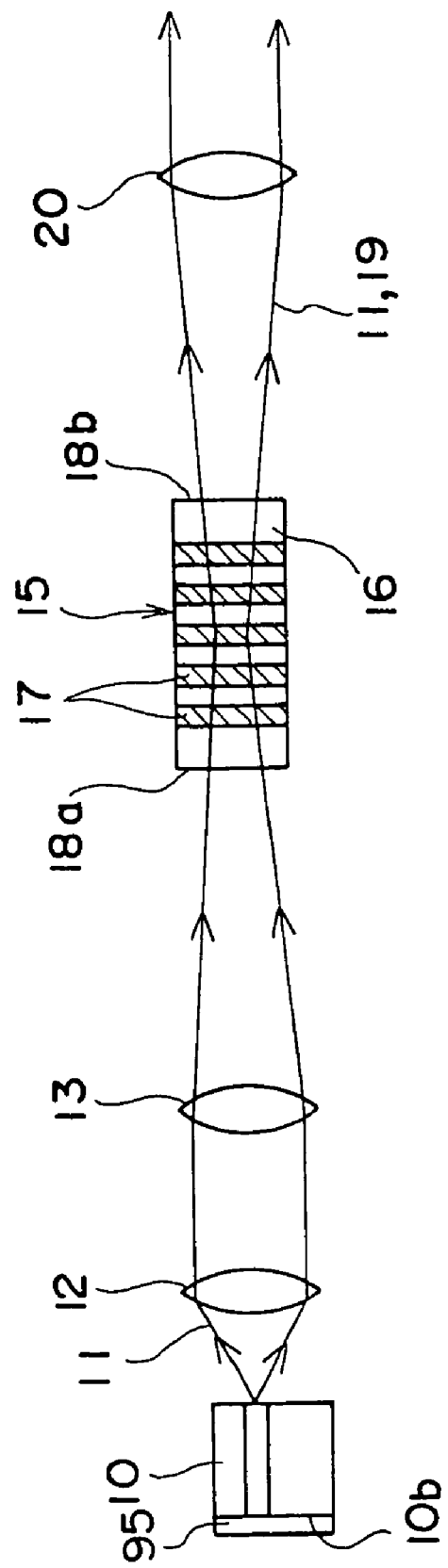
FIG. 16 is a schematic side view showing a light wavelength conversion module according to a fourteenth embodiment of the present invention.

Of course, the lenses 12 and 13 can be omitted from the structure illustrated in FIG. 16, and the semiconductor laser 10 can be coupled directly to the light wavelength conversion element 15.

Figure 17:
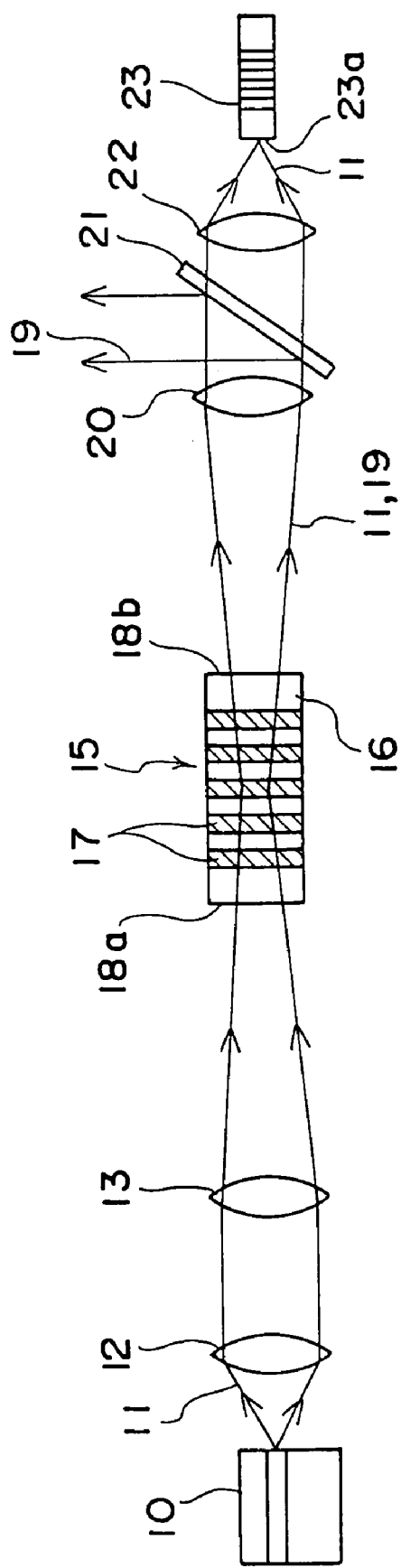
FIG. 17 is a schematic side view showing a light wavelength conversion module according to a fifteenth embodiment of the present invention.

Referring now to FIG. 17, a fifteenth embodiment of the present invention will be described. Comparing a light wavelength conversion module of the fifteenth embodiment with the one shown in FIG. 14, the difference is that, in the present fifteenth embodiment, a fiber grating 23 is provided in place of the bulk grating 92.

The laser beam 11 whose wavelength has not been converted is emitted in a divergent condition from the end surface 18b of the light wavelength conversion element 15 and is transformed into parallel rays by the collimator lens 20. The second harmonic wave 19 which has been made parallel is reflected by a dichroic mirror 21 to be directed toward a position at which the second harmonic wave 19 will be used. On the other hand, the laser beam 11 whose wavelength has not been converted is transmitted through the dichroic mirror 21 and is condensed by the condensing lens 22 and converged on an end surface of the fiber grating 23.

Figure 18:
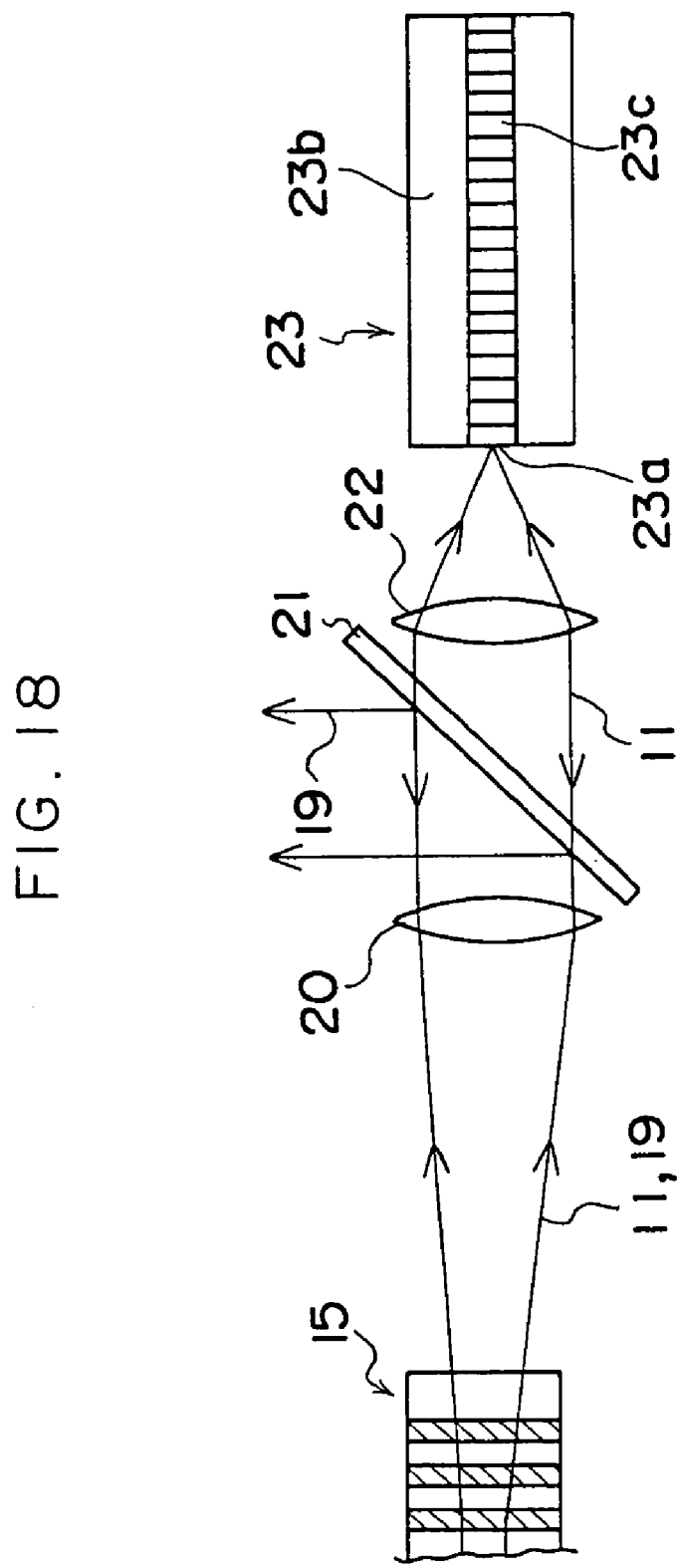
FIG. 18 is a schematic side view showing main portions of the light wavelength conversion module according to the fifteenth embodiment of the present invention.

The fiber grating 23, as shown in detail in FIG. 18, is an optical fiber comprising a clad 23b in which a core 23c having a higher refractive index than the clad 23b is embedded. A plurality of refractive index changing portions are formed at regular intervals at the core 23c. The fiber grating 23 is produced, for example, by forming interference fringes on an optical fiber core 23c, which is used for an optical transmission system and has a clad outside diameter of 125 $\mu$m and a core diameter of about 10 $\mu$m, by means of dual luminous flux interference exposure using an excimer laser beam having a wavelength of 248 nm, i.e., a wavelength in the ultraviolet region, and then by changing (increasing) the refractive index of the core 23c at the portion where light is irradiated. It is thought that the changes in the refractive index are due to the germanium oxide doped on the core 23c being chemically changed due to the ultraviolet irradiation.

The fiber grating 23 is provided such that an end surface 23a of the core is disposed at the position at which the laser beam 11 which has passed through the condensing lens 22 converges. At this position, the laser beam 11 enters the core 23c from the core end surface 23a and is propagated therethrough. The refractive index changing portions formed in the core 23c comprise a grating (diffraction grating) along the propagating direction of the laser beam 11. The grating reflects and diffracts only lights with particular wavelength corresponding to the period $\Lambda_{FG}$ among the laser beams which are propagated through the core 23c, and then directs them to be fed back to the semiconductor laser 10 via the light wavelength conversion element 15. That is, in this apparatus, the grating formed in the core 23c and a rear end surface (the left side end surface in FIG. 17) of the semiconductor laser 10 form an external resonator of the semiconductor laser 10.

Therefore, the oscillation wavelength of the semiconductor laser 10 can be selected and locked to a wavelength which phase-matches the period of the domain reversing segment 17 by setting the period $\Lambda_{FG}$ of the grating to a predetermined value.

Figure 19:
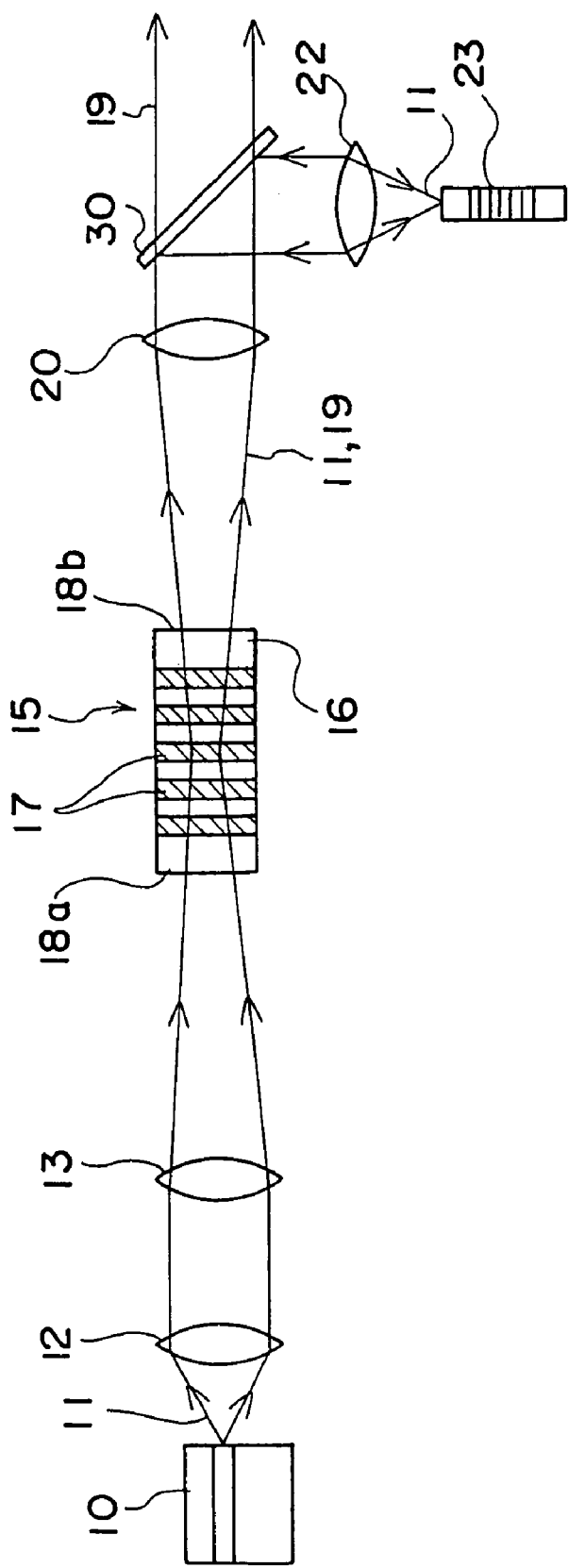
FIG. 19 is a schematic side view showing a light wavelength conversion module according to a sixteenth embodiment of the present invention.

Referring now to FIG. 19, a sixteenth embodiment of the present invention will be described. In a light wavelength conversion module of the sixteenth embodiment, the second harmonic wave 19 is transmitted through a dichroic mirror 30 and directed to a position at which it is used while the laser beam 11 is reflected by the dichroic mirror 30 to be led to the fiber grating 23.

Also in this case, the grating formed in the core of the fiber grating 23 and a rear end surface (the left side end surface in FIG. 19) of the semiconductor laser 10 form an external resonator of the semiconductor laser 10, thereby producing the same effects as the apparatus shown in FIG. 17.

Figure 20:
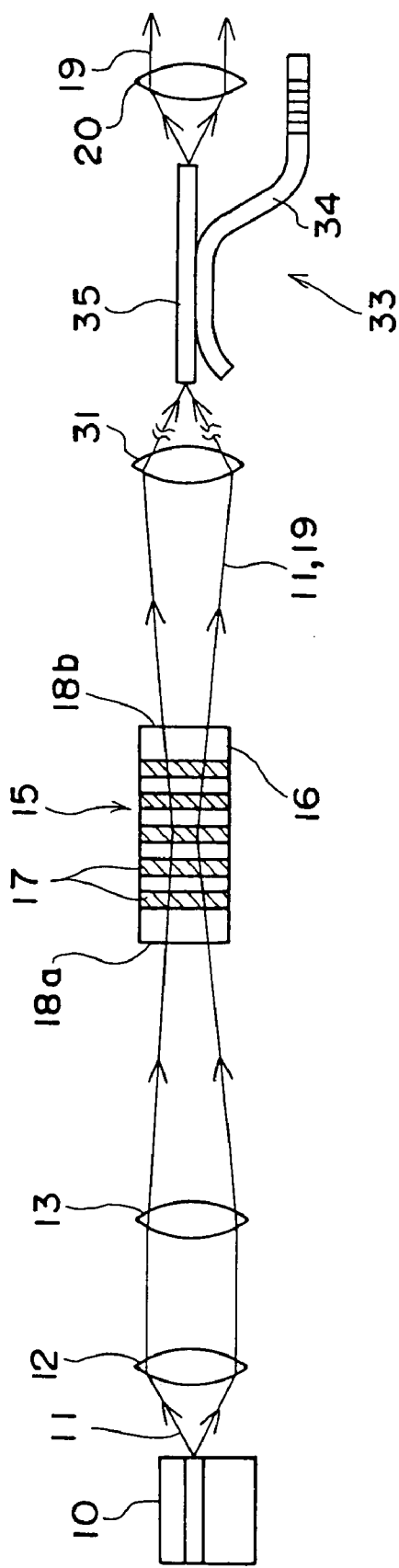
FIG. 20 is a schematic side view showing a light wavelength conversion module according to a seventeenth embodiment of the present invention.

Referring now to FIG. 20, a seventeenth embodiment of the present invention will be described. A light wavelength conversion module of the seventeenth embodiment differs from the one shown in FIG. 17 in that, a different means for separating the laser beam 11 whose wavelength has not been converted from the second harmonic wave 19 is utilized. That is, in this apparatus, a first fiber 34 having refractive index changing portions similar to those described above and a second fiber 35 coupled to the first fiber 34 are used as a fiber grating 33. The first fiber 34 and the second fiber 35 form a wavelength selecting fiber coupler.

The laser beam 11 and the second harmonic wave 19, which are emitted in a divergent condition from the light wavelength conversion element 15, are converged by a condensing lens 31 functioning as a converging optical system. At the position of convergence, an end surface of the second fiber 35 of the fiber grating 33 is disposed, and the laser beam 11 and the second harmonic wave 19 enter the second fiber 35. The second harmonic wave 19 which has entered into and has been propagated through the second fiber 35 is emitted in a divergent condition from the other end surface of the second fiber 35 and, after being transformed into parallel rays by the collimator lens 20, is directed to a position at which it is to be used.

On the other hand, the laser beam 11 which has entered into and has been propagated through the second fiber 35 is diverted to the first fiber 34 at a junction of both fibers 34 and 35, and is propagated through the first fiber 34 and reflected and diffracted at the refractive index changing portions. The reflected and diffracted laser beam 11 is fed back via the second fiber 35 and the light wavelength conversion element 15 to the semiconductor laser 10. Effects similar to those of the apparatus shown in FIG. 17 can be obtained in this case as well.

Or, in a manner opposite to that described above, the laser beam 11 and the second harmonic wave 19 converged by the condensing lens 31 may enter the first fiber 34 first, and the second harmonic wave 19 which has been propagated through the first fiber 34 may then be diverted to the second fiber 35.

In all of the above-described fifteenth, sixteenth and seventeenth embodiments, the laser beam 11, which is emitted from the light wavelength conversion element 15 as the fundamental wave and whose wavelength is not converted, is reflected and diffracted by the fiber grating. Three other embodiments will be described hereinafter in which the laser beam 11 is reflected and diffracted by the fiber grating before entering the light wavelength conversion element 15.

Figure 21:
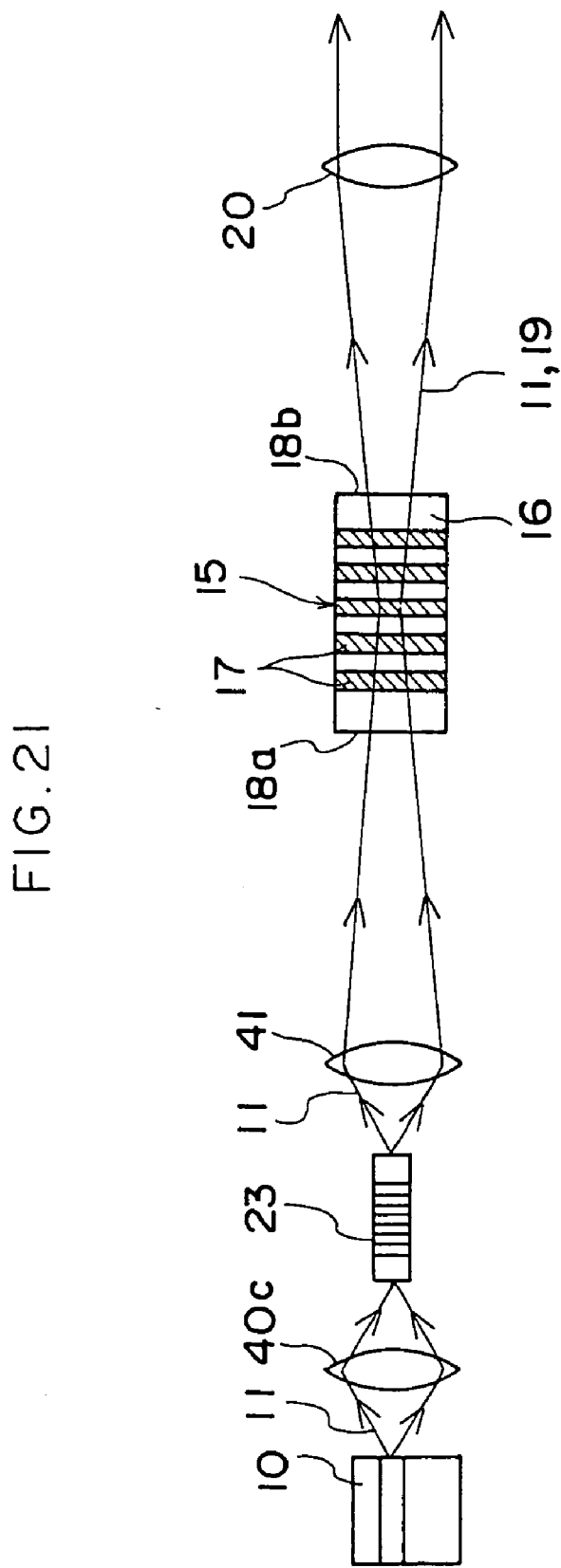
FIG. 21 is a schematic side view showing a light wavelength conversion module according to an eighteenth embodiment of the present invention.

FIG. 21 illustrates a light wavelength conversion module according to an eighteenth embodiment of the present invention. In this light wavelength conversion module, the laser beam 11 emitted in a divergent condition from the semiconductor laser 10 is converged by a condensing lens 40c functioning as a converging optical system. At a position of convergence thereof, an end surface of the fiber grating 23 similar to the one used in the apparatus shown in FIG. 17 is disposed, and the laser beam 11 enters the fiber grating 23.

A part of the laser beam 11 propagated through the fiber grating 23 is reflected and diffracted at the refractive index changing portions of the fiber grating 23. The reflected and diffracted laser beam 11 is fed back via the condensing lens 40 to the semiconductor laser 10. Effects similar to those of the apparatus shown in FIG. 17 can be obtained in this case as well.

On the other hand, the laser beam 11 which has been propagated through the fiber grating 23 and has been emitted from the other end surface is condensed by a condensing lens 41 and enters the light wavelength conversion element 15, where the wavelength thereof is converted so as to obtain the second harmonic wave 19. The second harmonic wave 19 and the laser beam 11 which are emitted in a divergent condition from the light wavelength conversion element 15 are transformed into parallel rays by the collimator lens 20, and the second harmonic wave 19 is directed to a position at which it will be used. In order to separate the second harmonic wave 19 from the laser beam 11, methods such as those as described above may be used appropriately.

Figure 22:
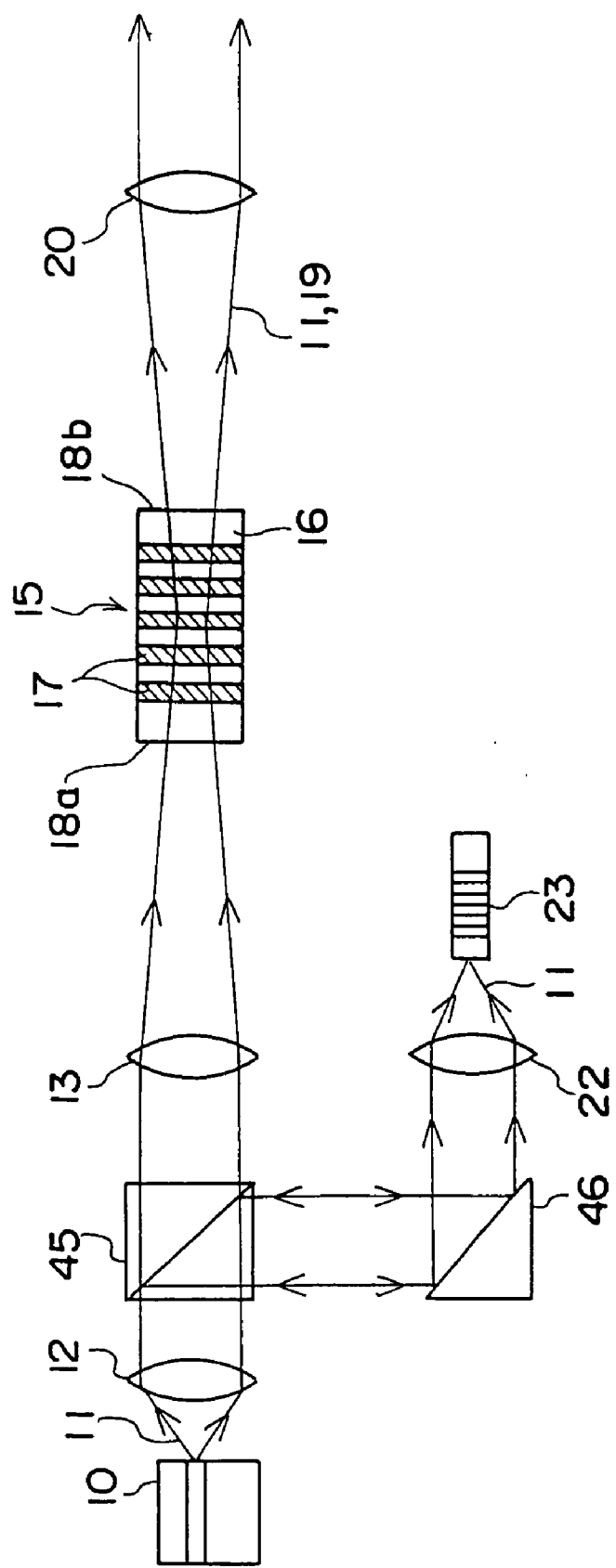
FIG. 22 is a schematic side view showing a light wavelength conversion module according to a nineteenth embodiment of the present invention.

Referring now to FIG. 22, a nineteenth embodiment of the present invention will be described. In a light wavelength conversion module of the nineteenth embodiment, the laser beam 11 which has been transformed into parallel rays by the collimator lens 12 is split by means of a beam splitter 45. That is, the laser beam 11 passing through the beam splitter 45 is led to the light wavelength conversion element 15 in the same manner as in the apparatus shown in FIG. 17. The laser beam 11 reflected by the beam splitter 45 is reflected by a mirror 46, and thereafter, is condensed by the condensing lens 22 and enters the fiber grating 23.

The laser beam 11 which has entered into and has been propagated through the fiber grating 23 is reflected and diffracted at the refractive index changing portions of the fiber grating 23. The reflected and diffracted laser beam 11 is fed back via the mirror 46, the beam splitter 45 and the like to the semiconductor laser 10. Effects similar to those of the apparatus shown in FIG. 17 can be obtained in this case as well.

In the present nineteenth embodiment, the collimator lens 12 and the condensing lens 22 form a converging optical system which converges the laser beam 11 before the laser beam 11 enters the light wavelength conversion element 15.

Figure 23:
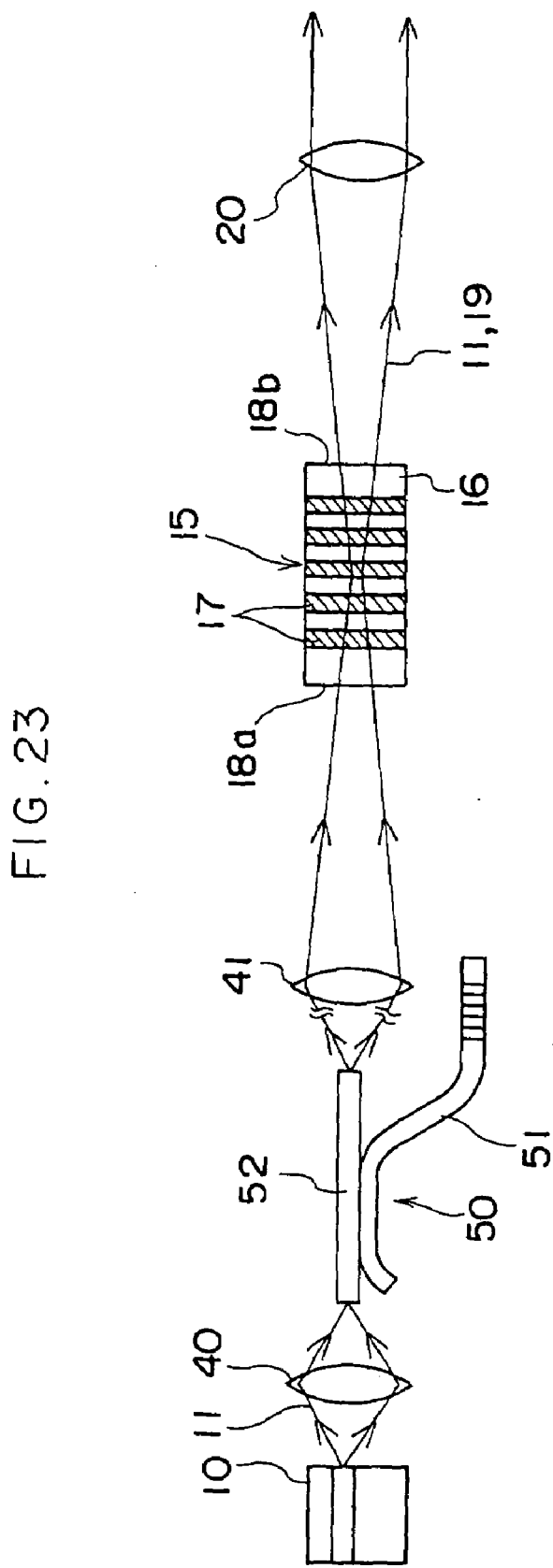
FIG. 23 is a schematic side view showing a light wavelength conversion module according to a twentieth embodiment of the present invention.

Referring now to FIG. 23, a twentieth embodiment will be described. Comparing a light wavelength conversion module of the twentieth embodiment with the one described above and shown in FIG. 21, the difference is that, in the present twentieth embodiment, a fiber grating 50 which forms a fiber coupler is used in place of the fiber grating 23. The fiber grating 50 comprises a first fiber 51 having refractive index changing portions and a second fiber 52 coupled to the first fiber 51.

A part of the laser beam 11 which has entered into and has been propagated through the second fiber 52 is diverted to the first fiber 51 at a junction of the fibers 51 and 52. Namely, the laser beam 11 diverges into two systems. The laser beam 11 propagated through the second fiber 52 and emitted from the other end surface thereof is condensed by the condensing lens 41 and enters the light wavelength conversion element 15, where the wavelength thereof is converted so as to obtain the second harmonic wave 19. The second harmonic wave 19 and the laser beam 11 emitted in a divergent condition from the light wavelength conversion element 15 are transformed into parallel rays by the collimator lens 20, and the second harmonic wave 19 is led to a position where it is to be used. In order to separate the second harmonic wave 19 from the laser beam 11, methods such as those described above may be used appropriately.

On the other hand, the laser beam 11 diverted to the first fiber 51 is propagated through the first fiber 51 and is reflected and diffracted at the refractive index changing portions of the first fiber 51. The reflected and diffracted laser beam 11 is fed back via the condensing lens 40 to the semiconductor laser 10. Effects similar to those of the apparatus shown in FIG. 17 can be obtained in this case as well.

Figure 24:
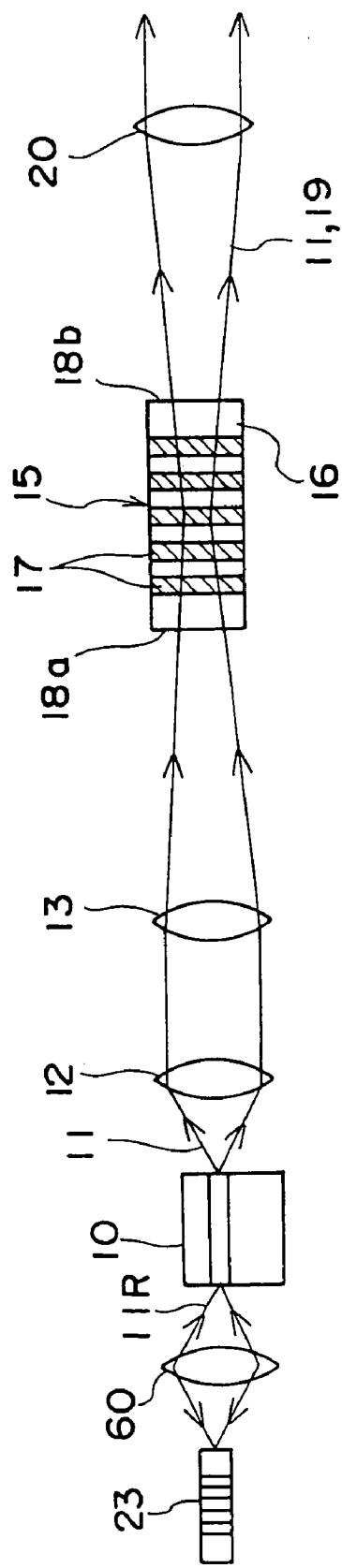
FIG. 24 is a schematic side view showing a light wavelength conversion module according to a twenty-first embodiment of the present invention.

Referring now to FIG. 24, a twenty-first embodiment of the present invention, in which the oscillation wavelength of the semiconductor laser 10 is selected and locked by utilizing backward emitted light thereof, will be described. In a light wavelength conversion module of the twenty-first embodiment, the laser beam 11R (backward emitted light), which is not directed toward the light wavelength conversion element 15, is converged by a condensing lens 60 functioning as a converging optical system, and enters the fiber grating 23. The laser beam 11R which has entered into the fiber grating 23 is reflected and diffracted at the refractive index changing portions of the fiber grating 23. The reflected and diffracted laser beam 11R is fed back via the condensing lens 60 to the semiconductor laser 10. Effects similar to those of the apparatus shown in FIG. 17 can be obtained in this case as well.

Moreover, as described hereinafter, the light wavelength conversion module of the present invention may comprise a light modulation device for modulating the luminous intensity of the laser beam emitted from the light wavelength conversion element.

Figure 25:
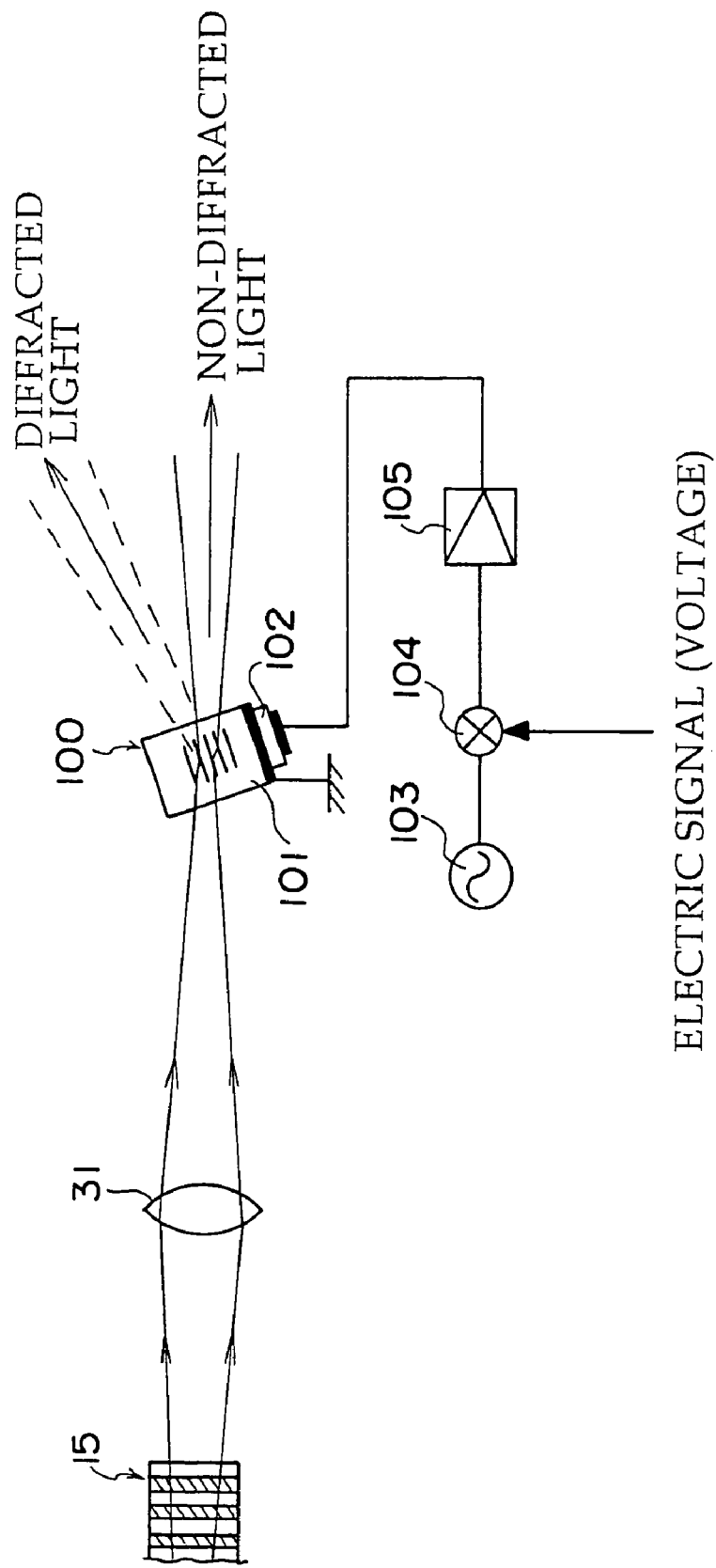
FIG. 25 is a schematic side view showing a light wavelength conversion module according to a twenty-second embodiment of the present invention.

FIG. 25 is a schematic side view showing a light wavelength conversion module according to a twenty-second embodiment of the present invention, in which a light modulation device using an acousto-optical modulator (AOM) is provided. Comparing the light wavelength conversion module of the present embodiment with the one shown in FIG. 1 and described above, the difference is that the light modulation device is provided in the present twenty-second embodiment. As shown in FIG. 25, the light modulation device comprises an AOM 100 and an oscillator 103. The AOM 100 is formed of an acousto-optical medium 101 and a transducer 102 for providing vibration to the acousto-optical medium 101. The oscillator 103 applies high-frequency signals to the transducer 102. The oscillator 103 is connected to the transducer 102 via a mixer 104 to which external electric signals are input, and a radio frequency (RF) amplifier 105.

In the same manner as the case using the light wavelength conversion module shown in FIG. 1, the second harmonic wave 19 emitted from the light wavelength conversion element 15 enters into the acousto-optical medium 101 via the condensing lens 31, and proceeds straight through the acousto-optical medium 101 in such a state that the transducer 102 is not vibrated by high-frequency signals of about 100 to 200 MHz output from the oscillator 103. On the other hand, when the transducer 102 is vibrated by high-frequency signals, an ultrasonic wave is generated at the transducer 102. The ultrasonic wave changes the distribution of the refractive index within the acousto-optical medium 101, and a diffraction grating is formed. The second harmonic wave 19 which has entered into the acousto-optical medium 101 is refracted by the diffraction grating.

The diffraction efficiency $\eta$ and thus the light intensity change according to the intensity of the ultrasonic wave generated at the transducer 102. Therefore, when the high-frequency signals are amplitude-modulated by means of controlling the voltage level of the electrical signals applied to the transducer 102, the diffraction efficiency $\eta$ changes according to the amplitude of the electrical signals, so that intensity modulation of the laser beam can be carried out. For example, when the high-frequency signals are amplitude-modulated either to zero amplitude or to a predetermined amplitude, the light to be modulated will be modulated on and off. When the high-frequency signals are amplitude-modulated continuously, the light to be modulated will be intensity-modulated continuously.

In the present twenty-second embodiment, the light wavelength conversion module comprising a light modulation device which modulates the intensity after wavelength conversion is used. However, wavelength conversion may be performed after intensity modulation. One way in which the intensity can be modulated in such a manner is to modulate the intensity of the fundamental wave generated at the semiconductor laser by changing the driving current of the semiconductor laser.

The semiconductor laser is a device driven by electric current. The output light amount thereof is controlled by increasing and decreasing the current, thereby enabling the output amount of the wavelength-converted light to be adjusted to an arbitrary amount. Conventionally, there has been a problem that when the driving current of the semiconductor laser is changed, the output of the second harmonic wave fluctuates due to the fluctuations in the wavelength of the semiconductor laser. Thus, a method of effecting intensity-modulation by means of changing the driving current has not been adopted in light wavelength conversion elements using a semiconductor laser as a light source.

In the light wavelength conversion modules of the present invention, since the oscillation wavelength of the semiconductor laser is locked, the method of modulating the intensity by means of changing the driving current of the semiconductor laser can be adopted. As described above, the intensity of the second harmonic wave is proportional to the square of the intensity of the laser beam which is the fundamental wave, so that when the output light amount range of the semiconductor laser is 18 dB, the output light amount range of the second harmonic wave is 36 dB. Accordingly, a wide light amount range (dynamic range) of 25 dB or more, which is required for obtaining a photographic image of high quality on a silver salt photosensitive material, is ensured.

A light scanning and recording apparatus of the present invention will be described hereinafter.

Conventionally, a light scanning and recording apparatus which records an image borne by image signals onto, for example, a photosensitive recording material by modulating a light beam on the basis of the image signals and by scanning the modulated light beam on the photosensitive recording material, is well known. In such a light scanning and recording apparatus, it is necessary to modulate the light beam on the basis of the image signals. Therefore, the above-described light wavelength conversion module comprising the light modulation device can be utilized as a light source of such a light scanning and recording apparratus.

Especially when the method of intensity-modulating the fundamental wave generated at the semiconductor laser by locking the wavelength of the semiconductor laser and changing the driving current thereof is used, a wide dynamic range of the second harmonic wave is secured as described previously, so that an image of a higher gradation can be recorded.

Figure 26:
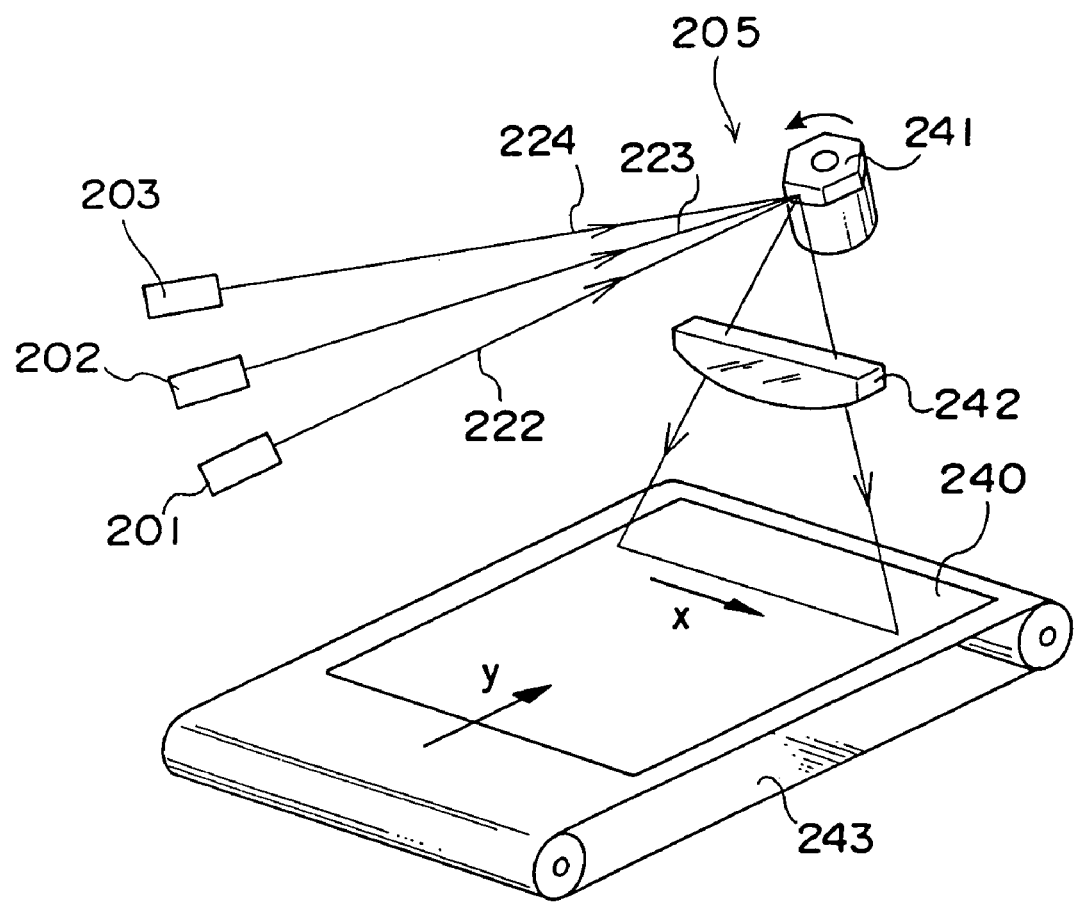
FIG. 26 is a schematic perspective view showing a light scanning and recording apparatus according to the present invention.

FIG. 26 illustrates a perspective configuration of a light scanning and recording apparatus of the present invention. As illustrated in FIG. 26, the light scanning and recording apparatus comprises a light wavelength conversion module 201 for blue recording light which carries out light modulation and light wavelength conversion, a light wavelength conversion module 202 for green recording light which carries out light modulation and light wavelength conversion, a semiconductor laser 203 for red recording light, and a light scanning section 205 which moves the recording light on a recording material.

The light wavelength conversion module, in which the light modulation device which modulates light by changing the driving current of the semiconductor laser is provided, is used as the light wavelength conversion module 201 for blue recording light and the light wavelength conversion module 202 for green recording light. In the light wavelength conversion modules 201 and 202, the intensity of the laser beam emitted from the semiconductor laser can be modulated by directly controlling the driving current of the semiconductor laser, i.e. the light source, on the basis of the image signals bearing blue color information and the image signals bearing green color information, respectively, of a color image of a continuous tone. Accordingly, intensity of a blue second harmonic wave 222 and a green second harmonic wave 223 can also be modulated.

The light scanning section 205 comprises a rotating polygon mirror 241 which serves as a main scanning device and is disposed such that the blue second harmonic wave 222, the green second harmonic wave 223, and a red recording light 224 are incident thereon; an fθ lens 242 which converges the lights 222, 223 and 224 reflected and deflected by the polygon mirror 241 onto a given scanning surface irrespective of their deflection angles; and a sub-scanning device 243 which conveys a color photosensitive recording material 240 in the direction indicated by arrow y at a constant speed. The lights 222, 223 and 224 of three colors reflected and deflected by the polygon mirror 241 scan the recording material 240 in a main scanning direction indicated by arrow x which is substantially perpendicular to the direction of arrow y. Further, the recording material 240 is conveyed by the sub-scanning device 243 as described above so as to be sub-scanned.

The intensity of the red recording light 224 is also modulated by controlling the driving current of the semiconductor laser 203 for the red recording light on the basis of the image signals bearing red color information of a color image of a continuous tone. A color image of a continuous tone is recorded on the recording material 240 by the blue second harmonic wave 222, the green second harmonic wave 223, and the red recording light 224 scanning the recording material 240 in two-dimensions as described above.

A color image was actually recorded on a silver salt photosensitive material by using a light scanning and recording apparatus with such a structure. The blue recording light 222 was oscillated with an oscillation wavelength of 475 nm and an output light amount of 1 mW by using a transverse single mode semiconductor laser having an oscillation wavelength of 950 nm and an output light amount of 300 mW as a light source, and by using a light wavelength conversion element which was formed of a bulk-shaped period reversing domain crystal of $LiNbO_3$ doped with 5 mol % MgO and which had a total length of 4 mm and a periodic pitch of 4.7 μm. The green recording light 223 was oscillated with an oscillation wavelength of 532 nm and an output light amount of 0.9 mW by using a transverse single mode semiconductor laser having an oscillation wavelength of 1064 nm and an output light amount of 300 mW as a light source, and by using a light wavelength conversion element formed of a bulk-shaped period reversing domain crystal of $LiNbO_3$ which was doped with 5 mol % MgO and which had a total length of 5 mm and a periodic pitch of 6.97 μm. The red recording light 224 was oscillated directly from a semiconductor laser having an oscillation wavelength of 670 nm and an output light amount of 10 mW. The resultant image was a color image of continuous tone with high gradation.

While intensity modulation of the second harmonic wave, which is recording light, is carried out on the basis of the image signals in the present embodiment, a pulse width modulation may be carried out in place of intensity modulation.

Moreover, the wavelength conversion efficiency of the wavelength conversion element is proportional to the square of the power density of the fundamental wave i.e., the semiconductor laser. Thus, with the power of the semiconductor laser the same in both cases, a higher conversion efficiency can be obtained when the semiconductor laser is driven at high frequency than when it is driven by a continuous wave (CW).

High-frequency waves become undesired signals when they have a frequency close to the modulation frequency of the recording image. Thus, the high-frequency waves must have a higher frequency than the modulation frequency of the recording image. Assuming that, for example, an upper limit of the frequency of the image signals is 10 MHz, it is preferable for the high-frequency waves to be 100 MHz or more, that is, at least 10 times higher than the frequency of the image signals. With such high frequencies, since the high-frequency component becomes a vibration component in a pixel and cannot be resolved, such an arrangement presents no problems in practice. The upper limit of the frequency may be set as high as about 1 GHz, that is, equivalent to the speed of response of the semiconductor laser.

The driving waveform of the high-frequency waves may be either a sine wave or a pulse wave. In the case of a pulse wave, since a pulse wave with a narrower pulse width has a higher peak value and the wavelength conversion efficiency of the wavelength conversion element improves due to the above-described square effect being marked, it is preferable to use a pulse wave with a narrow pulse width.

When intensity modulation or pulse width modulation of the semiconductor laser is carried out, the semiconductor laser is driven with high-frequency signals superposed on the image signals.

While the intensities of all of the semiconductor lasers are directly modified in the present embodiment, some or all of the semiconductor lasers may be modulated externally by means of the light modulation device using the AOM, or the like.

In the present embodiment, the second harmonic wave is used only for the blue recording light 222 and the green recording light 223, and the semiconductor laser is used as it is as the light source for the red recording light 224 without being combined with the light wavelength conversion device. However, it is possible to use a second harmonic wave only for the blue recording light 222, and to use semiconductor lasers as light sources for the green recording light 223 and the red recording light 224 without the semiconductor lasers being combined with the light wavelength conversion device. However, in recording color images, it is preferable to secure a dynamic range for the red recording light 224 which is basically equivalent to that of the second harmonic wave 222. Also, it is preferable that the red recording light 224 is a second harmonic wave obtained by converting the wavelength of fundamental wave of a certain wavelength and modulating the fundamental wave prior to wavelength conversion.

The light scanning and recording apparatus of the present invention can be structured to record not only color images, but also monochrome images. Even in such a case, similar effects can be obtained so that a wide dynamic range of recording lights can be secured and an image of a continuous tone with a high gradation can be recorded.

What is claimed is:

1. A light wavelength conversion module comprising:
(a) a light wavelength conversion element formed of a bulk-shaped wavelength conversion crystal, said light wavelength conversion element being for converting a wavelength of a fundamental wave, said light wavelength conversion element having an end surface;
(b) a semiconductor laser for emitting a laser beam for entering said light wavelength conversion element as the fundamental wave; and
(c) a transmission type wavelength selecting optical element disposed between said semiconductor laser and said light wavelength conversion element, said wavelength selecting optical element selecting a wavelength of the laser beam which is reflected by an end surface of said light wavelength conversion element and is to be fed back to said semiconductor laser,
wherein said wavelength selecting optical element selects a wavelength of the laser beam reflected by the end surface of said light wavelength conversion element, wherein the laser beam enters said light wavelength conversion element at the end surface.

2. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave;
a light separating device for separating a part of the laser beam before the laser beam enters into said light wavelength conversion element;
a reflecting member reflecting the separated laser beam so as to feed back the separated laser beam to said semiconductor laser; and
a transmission type wavelength selecting optical element selecting a wavelength of the reflected laser beam which is to be fed back to said semiconductor laser via the light separating device,
wherein the laser beam enters said light wavelength conversion element in as a converging beam and the laser beam emits from the light wavelength conversion element as a diverging beam.

3. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave;
a reflecting member reflecting the laser beam which is emitted from said light wavelength conversion element and is to be fed back to said semiconductor laser; and
a transmission type wavelength selecting optical element which selects a wavelength of the laser beam which is to be fed back to said semiconductor laser,
wherein the laser beam enters said light wavelength conversion element as a converging beam and the laser beam emits from the light wavelength conversion element as a diverging beam.

4. A light wavelength conversion module according to claim 3, further comprising an optical system which separates a wavelength-modulated wave from the laser beam emitted from said light wavelength conversion element.

5. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave;
a reflecting member reflecting a laser beam emitted from said semiconductor laser as a backward emitted light, which is directed in a direction other than toward said light wavelength conversion element, so as to feed back the laser beam to said semiconductor laser; and
a transmission type wavelength selecting optical element which selects a wavelength of the reflected laser beam which is to be fed back to said semiconductor laser,
wherein the laser beam enters said light wavelength conversion element as a converging beam and the laser beam emits from the light wavelength conversion element as a diverging beam.

6. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave; and
a reflection type wavelength selecting optical element disposed between said semiconductor laser and said light wavelength conversion element, said wavelength selecting optical element reflecting a part of said laser beam so as to feed back the part of the laser beam to said semiconductor laser and selecting a wavelength of the part of the laser beam to be fed back,
wherein the laser beam enters said light wavelength conversion element as a converging beam and the laser beam emits from the light wavelength conversion element as a diverging beam.

7. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave; and
a reflection type wavelength selecting optical element which reflects a laser beam which has exited from said light wavelength conversion element so as to feed back the laser beam to said semiconductor laser, and which selects a wavelength of the laser beam to be fed back,
wherein the laser beam enters said light wavelength conversion element as a converging beam and the laser beam emits from the light wavelength conversion element as a diverging beam.

8. A light wavelength conversion module according to claim 7, further comprising a light modulation device and an optical system which separates a wavelength-modulated wave from the laser beam which has exited from said light wavelength conversion element.

9. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave; and
a reflection type wavelength selecting optical element which reflects a laser beam emitted from said semiconductor laser as a backward emitted light, which is directed in a direction other than toward said light wavelength conversion element, so as to feed back the laser beam to said semiconductor laser, and which selects a wavelength of the laser beam to be fed back,
wherein the laser beam enters said light wavelength conversion element as a converging beam and the laser beam emits from the light wavelength conversion element as a diverging beam.

10. A light wavelength conversion module according to claim 1, wherein said wavelength selecting optical element is a narrow band-pass filter.

11. A light wavelength conversion module according to claim 10, wherein said narrow band-pass filter is a thin film type band pass filter.

12. A light wavelength conversion module according to claim 11, wherein said thin film type band pass filter is formed on a light emitting end surface of said semiconductor laser.

13. A light wavelength conversion module according to claim 10, wherein said narrow band-pass filter is a birefringent filter.

14. A light wavelength conversion module comprising:
a light wavelength conversion element formed of a bulk-shaped wavelength conversion crystal, said light wavelength conversion element converting a wavelength of a fundamental wave;
a semiconductor laser emitting a laser beam which is to enter said light wavelength conversion element as the fundamental wave;
a light separating device for separating a part of the laser beam before the laser beam enters into said light wavelength conversion element;
a reflecting member reflecting the separated laser beam so as to feed back the separated laser beam to said semiconductor laser; and
a transmission type wavelength selecting optical element selecting a wavelength of the reflected laser beam which is to be fed back to said semiconductor laser via the light separating device,
wherein said transmission type wavelength selecting optical element is a thin film type narrow band-pass filter, said band pass filter being formed on a surface of said reflecting member.

15. A light wavelength conversion module according to claim 1, wherein said wavelength selecting optical element is a bulk grating.

16. A light wavelength conversion module according to claim 6, wherein said reflection type wavelength selecting optical element is a fiber grating made of an optical fiber, a plurality of refractive index changing portions being formed at regular intervals on a core of the fiber grating.

17. A light wavelength conversion module according to claim 16, further comprising a converging optical system for converging a laser beam, which is to enter said fiber grating, onto an end surface of the core of said fiber grating.

18. A light wavelength conversion module according to claim 1, wherein said semiconductor laser is coupled to an end surface of said light wavelength conversion element.

19. A light wavelength conversion module comprising:
a light wavelength conversion element formed of a bulk-shaped wavelength conversion crystal, said light wavelength conversion element converting a wavelength of a fundamental wave;
a semiconductor laser coupled to an end surface of said light wavelength conversion element and emitting a laser beam which is to enter said light wavelength conversion element as the fundamental wave; and
a transmission type thin film narrow band-pass filter disposed between a light emitting surface of said semiconductor laser and an end surface of said light wavelength conversion element, said thin film narrow band-pass filter selecting a wavelength of the laser beam which is to be reflected by the end surface of said light wavelength conversion element and fed back to said semiconductor laser,
wherein the laser beam enters said light wavelength conversion element as a converging beam and the laser beam emits from the light wavelength conversion element as a diverging beam.

20. A light wavelength conversion module comprising:
a light wavelength conversion element formed of a bulk-shaped wavelength conversion crystal, said light wavelength conversion element converting a wavelength of a fundamental wave;
a semiconductor laser coupled to an end surface of said light wavelength conversion element and emitting a laser beam which is to enter said light wavelength conversion element as the fundamental wave; and
a reflection type thin film narrow band-pass filter disposed between a light emitting surface of said semiconductor laser and an end surface of said light wavelength conversion element, said thin film narrow band-pass filter reflecting a part of the laser beam so as to feed back the part of the laser beam to said semiconductor laser, and selecting a wavelength of the part of the laser beam to be fed back, wherein the laser beam enters said light wavelength conversion element as a converging beam and the laser beam emits from the light wavelength conversion element as a diverging beam.

21. A light wavelength conversion module according to claim 1, wherein said bulk-shaped wavelength conversion crystal is one of the following compositions:
 i) LiNbO3 doped with MgO or ZnO; or
 ii) LiTaO3, LiNbO3, LiTaO3, KTiOPO4, KNbO3 doped with MgO or ZnO.

22. A light wavelength conversion module according to claim 1, wherein said bulk-shaped wavelength conversion crystal is a periodic domain reversing crystal on which domain reversing segments having reversed directions of spontaneous polarization are formed periodically, said periodic domain reversing crystal converting the wavelength of the fundamental wave guided in a direction along which said domain reversing segments are aligned.

23. A light wavelength conversion module according to claim 1, wherein said semiconductor laser is a high power semiconductor laser which has an output power of 300 mW or more.

24. A light wavelength conversion module according to claim 1, wherein said semiconductor laser is a semiconductor laser which emits the laser beam in a single-peak spatial mode.

25. A light wavelength conversion module according to claim 1, further comprising a light modulation device for modulating the intensity of the laser beam which has exited from said light wavelength conversion element.

26. A light wavelength conversion module according to claim 1, further comprising a light modulation device for modulating the intensity of the laser beam which has exited from said light wavelength conversion element, by changing a driving current of said semiconductor laser to modulate the intensity of the fundamental wave emitted from said semiconductor laser.

27. A light wavelength conversion module according to claim 1, further comprising a light modulation device for modulating the pulse of said laser beam which has exited from said light wavelength conversion element.

28. A light scanning and recording apparatus comprising:
 a light wavelength conversion module comprising a light modulation device for modulating the intensity or the pulse of a recording light on the basis of image signals expressing an image of a continuous tone, and a light wavelength conversion device for, by a nonlinear optical effect, converting the wavelength of the recording light whose intensity or pulse has been modulated; and
 a scanning device for scanning a recording material with the recording light whose wavelength has been converted,
 wherein said light scanning and recording apparatus utilizes the light wavelength conversion module according to claim 25 as said light wavelength conversion module,
 wherein the laser beam enters said light wavelength conversion element as a converging beam and the laser beam emits from the light wavelength conversion element as a diverging beam.

29. The light wavelength conversion module according to claim 22, wherein the domain reversing segments are formed to be clearly distinguished from each other and to penetrate from a first surface of the crystal to a second surface of the crystal.

30. The light wavelength conversion module according to claim 1, wherein the fundamental wave travels through crystal.

31. The wavelength conversion module according to claim 1, wherein said bulk-shaped wavelength conversion crystal is periodic domain reversing crystal on which domain reversing segments having reversed directions of spontaneous polarization are formed periodically to be clearly distinguished from each other and to penetrate from a first surface of the crystal to a second surface of the crystal, said periodic domain reversing crystal converting the wavelength of the fundamental wave guided in a direction along which said domain reversing segments are aligned and through alternating layers of domain reversing segments and crystal.

32. The light wavelength conversion module according to claim 12, wherein said bulk-shaped wavelength conversion crystal is a periodic domain reversing crystal on which domain reversing segments having reversed directions of spontaneous polarization are formed periodically to be clearly distinguished from each other and to penetrate from a first surface of the crystal to a second surface of the crystal, said periodic domain reversing crystal converting the wavelength of the fundamental wave guided in a direction along which said domain reversing segments are aligned and through alternating layers of domain reversing segments and crystal.

* * * * *